United States Patent
Yoon et al.

(10) Patent No.: US 8,405,102 B2
(45) Date of Patent: Mar. 26, 2013

(54) LIGHT EMITTING DEVICE, AND LIGHTING APPARATUS

(75) Inventors: Hosang Yoon, Seoul (KR); Sanghyun Lee, Seoul (KR); Jongpil Jeong, Seoul (KR); Seonho Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 68 days.

(21) Appl. No.: 13/082,866

(22) Filed: Apr. 8, 2011

(65) Prior Publication Data

US 2011/0248238 A1 Oct. 13, 2011

(30) Foreign Application Priority Data

Apr. 9, 2010 (KR) ................. 10-2010-0032890

(51) Int. Cl.
*H01L 29/06* (2006.01)
*H01L 33/00* (2010.01)
(52) U.S. Cl. ............ 257/97; 257/13; 257/14; 257/96; 257/E33.008; 257/E33.025; 257/E33.028; 257/E33.049
(58) Field of Classification Search ............ 257/97, 257/E33.008–E33.009, E33.011, 13–14, 257/96, E33.025, E33.028, E33.049
See application file for complete search history.

(56) References Cited

U.S. PATENT DOCUMENTS

| 7,812,337 | B2 * | 10/2010 | Lee ..................... 257/13 |
| 2002/0175352 | A1 * | 11/2002 | Cao ..................... 257/258 |
| 2002/0195606 | A1 * | 12/2002 | Edmond et al. ........ 257/79 |
| 2003/0006418 | A1 * | 1/2003 | Emerson et al. ........ 257/79 |
| 2003/0205736 | A1 * | 11/2003 | Kozaki .................. 257/200 |
| 2004/0056259 | A1 * | 3/2004 | Goto et al. ............. 257/79 |
| 2004/0101012 | A1 * | 5/2004 | Nakamura et al. ..... 372/46 |
| 2006/0131558 | A1 * | 6/2006 | Sato et al. .............. 257/17 |
| 2007/0252135 | A1 * | 11/2007 | Lee ..................... 257/22 |
| 2007/0262293 | A1 * | 11/2007 | Fujikura ................ 257/13 |
| 2009/0162999 | A1 * | 6/2009 | Lin et al. .............. 438/483 |
| 2009/0200538 | A1 * | 8/2009 | Sasaki et al. ........... 257/14 |
| 2009/0242897 | A1 * | 10/2009 | Bergmann et al. ..... 257/76 |
| 2010/0320441 | A1 * | 12/2010 | Lee ..................... 257/13 |
| 2011/0187294 | A1 * | 8/2011 | Bergmann et al. ...... 315/363 |

FOREIGN PATENT DOCUMENTS

| JP | 2006-261392 A | 9/2006 |
| JP | 2009-152552 A | 7/2009 |
| WO | WO 2005/101532 A1 | 10/2005 |

* cited by examiner

*Primary Examiner* — Cheung Lee
*Assistant Examiner* — Jeremy Joy
(74) *Attorney, Agent, or Firm* — Birch, Stewart, Kolasch & Birch, LLP

(57) ABSTRACT

Disclosed herein is a light emitting device. The light emitting device includes a support member and a light emitting structure on the support member and including a first conductive semiconductor layer, a second conductive semiconductor layer and an active layer interposed between the first and second conductive semiconductor layers, and the active layer includes at least one quantum well layer and at least one barrier layer, at least one potential barrier layer located between the first conductive semiconductor layer and a first quantum well layer, closest to the first conductive semiconductor layer, out of the at least one quantum well layer, and an undoped barrier layer formed between the at least one potential barrier layer and the first quantum well layer and having a thickness different from that of the at least one barrier layer. Thereby, brightness of the light emitting device is improved through effective diffusion of current.

20 Claims, 16 Drawing Sheets

LIGHT EMITTING DEVICE, AND LIGHTING APPARATUS

CROSS-REFERENCE TO RELATED APPLICATION

This application claims the benefit of Korean Patent Application No. 10-2010-0032890, filed on Apr. 9, 2010 in the Korean Intellectual Property Office, the disclosure of which is incorporated herein by reference.

BACKGROUND OF THE INVENTION

1. Field of the Invention

The present embodiment relates to a light emitting device, a light emitting device package and a lighting apparatus.

2. Description of the Related Art

Group III-V nitride semiconductors are focus of attention as light emitting devices, such as light emitting diodes (LEDs) or laser diodes (LDs) due to physical and chemical characteristics thereof. Nitride-based light emitting devices generate light using an energy bandgap of an active layer located between an N-type GaN semiconductor layer and a P-type GaN semiconductor layer. Now, nitride-based light emitting devices generating light having wavelengths corresponding to green, red and blue colors are being utilized to emit white light using properly selected phosphors.

The application range of light emitting devices is being changed from conventional mobile apparatuses to TVs, backlight units (BLUs) for MNTs and general lighting apparatuses. In order to apply light emitting devices to TVs, MNTs and general lighting apparatuses, ESD tolerance of a designated level, generally ESD tolerance of a level of −2 KV, is required.

ESD means electrostatic discharge of several thousands of volts or more generally generated when an electronic apparatus contacts a charged object, and may damage power supply devices to provide power to light emitting devices and various other electronic apparatuses as well as the light emitting devices.

In general, nitride-based light emitting devices cannot have ESD tolerate of a level of −2 KV. Therefore, in case that a light emitting device is applied to an apparatus, such as a backlight unit, a Zener diode is added to one side of a light emitting device package, thus allowing the light emitting device to have ESD tolerance by means of the Zener diode.

However, when the Zener diode is added to the light emitting device package so as to allow the nitride-based light emitting device to have ESD tolerance, the Zener diode is located adjacent to the light emitting device in the package and thus influences brightness of the light emitting device. Further, if the surface of the Zener diode is formed in black, the Zener diode serves as a black body and thus absorbs a portion of light emitted from the light emitting device, thereby reducing brightness of the light emitting device. In addition, the Zener diode is received in the package, thereby increasing manufacturing costs of the overall package.

SUMMARY OF THE INVENTION

Therefore, the present embodiment has been made in view of the above problems, and provides a light emitting device which has high tolerance to ESD without mounting of any separate ESD device within a package and prevents forward voltage drop due to ESD prevention.

Also, the present embodiment provides a light emitting device which minimizes reduction in brightness while improving tolerance to ESD.

In accordance with one aspect of the present embodiment, the above and other embodiment can be accomplished by the provision of a light-emitting device including: a support member, and a light emitting structure formed on the support member and including a first conductive semiconductor layer, a second conductive semiconductor layer and an active layer interposed between the first conductive semiconductor layer and the second conductive semiconductor layer, wherein the active layer includes at least one quantum well layer and at least one barrier layer, at least one potential barrier layer located between the first conductive semiconductor layer and a first quantum well layer, closest to the first conductive semiconductor layer, out of the at least one quantum well layer, and an undoped barrier layer formed between the at least one potential barrier layer and the first quantum well layer and having a thickness different from that of the at least one barrier layer.

The light emitting device further include a potential compensation layer located between the second conductive semiconductor layer and a second quantum well layer, closest to the second conductive semiconductor layer, out of the at least one quantum well layer.

The potential compensation layer may have a thickness greater than that of the at least one potential barrier layer and smaller than that of the undoped barrier layer.

The potential compensation layer may have the same thickness as that of the at least one barrier layer.

The undoped barrier layer may have a thickness of 1.5 to 7.5 times that of the at least one barrier layer.

The undoped barrier layer may have a thickness of 7.5 to 100 times that of the at least one potential barrier layer.

The at least one potential barrier layer may include InN.

The potential compensation layer may include at least one of C, Si, Ge and Sn.

The potential compensation layer may have a thickness of 30~150 Å.

The at least one potential barrier layer may have a thickness of 3.5~40 Å.

The at least one potential barrier layer may include two potential barrier layers.

A concentration of InN of the at least one potential barrier layer may be 80% to 100%.

In accordance with one aspect of the present embodiment, the above and other embodiment can be accomplished by the provision of a light-emitting device including: a support member, and a light emitting structure formed on the support member and including a first conductive semiconductor layer, a second conductive semiconductor layer and an active layer interposed between the first conductive semiconductor layer and the second conductive semiconductor layer, wherein the active layer includes a light emitting layer in which a plurality of quantum well layers and a plurality of barrier layers are alternately formed, a potential barrier layer provided located between the light emitting layer and the first conductive semiconductor layer to delay time during which electrostatic discharge (ESD) proceeds from the first conductive semiconductor layer to the light emitting layer, and an undoped barrier layer provided between the light emitting layer and the potential barrier layer to isolate the potential barrier layer and the light emitting layer from each other.

The light emitting device may further include a potential compensation layer to compensate for forward voltage drop due to the potential barrier layer.

The potential barrier layer may diffuse carriers traveling from the first conductive semiconductor layer to the light emitting layer.

The potential compensation layer may have a thickness greater than that of the potential barrier layer and smaller than that of the undoped barrier layer.

The potential compensation layer may have the same thickness as that of the plurality of barrier layers.

The light emitting device may further include a second undoped barrier layer, and the second undoped barrier layer may be provided between the potential compensation layer and the light emitting layer to isolate the potential compensation layer and the light emitting layer from each other.

The potential barrier layer may include InN.

BRIEF DESCRIPTION OF THE DRAWINGS

The above and other embodiments, features and other advantages of the present embodiment will be more clearly understood from the following detailed description taken in conjunction with the accompanying drawings, in which.

DETAILED DESCRIPTION OF THE EMBODIMENTS

Figure 1:
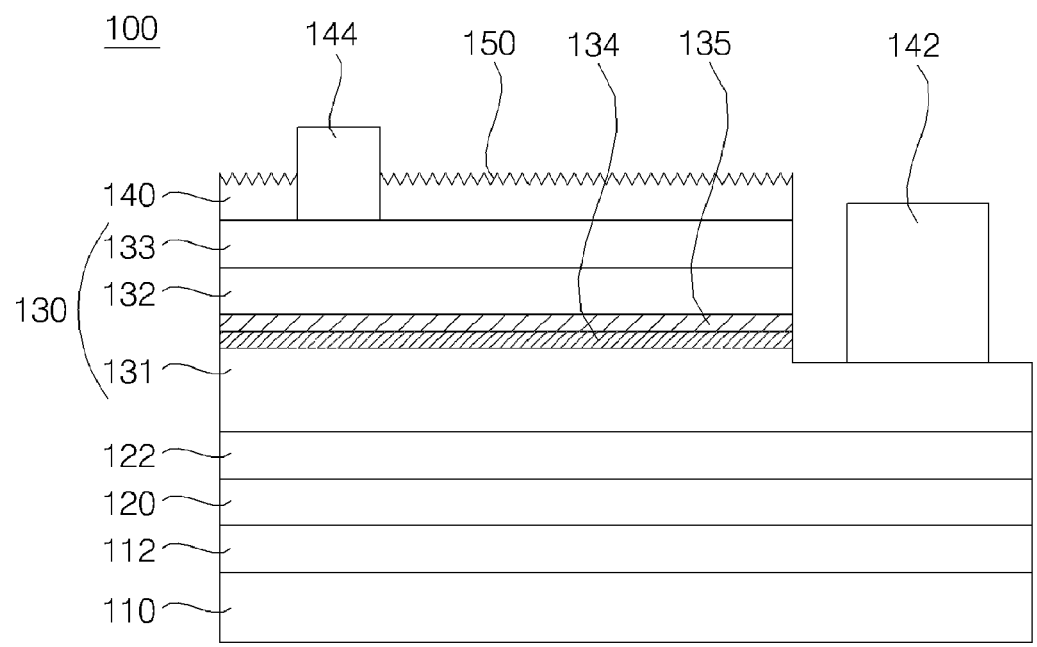
FIG. 1 is a cross-sectional view of a light emitting device in accordance with one embodiment of the present embodiment.

Reference will now be made in detail to exemplary embodiments, examples of which are illustrated in the accompanying drawings. Wherever possible, the same reference numbers will be used throughout the drawings to refer to the same or like parts.

Prior to description of the embodiments, it will be understood that when elements such as layers (films), regions, patterns or substrates, which will be referred to below, are referred to as being "on" or "under" other elements, such as layers (films), regions, pads, patterns or structures, they can be directly or indirectly on or under the other elements.

Position relations between respective layers or structures are illustrated based on the description of the embodiments and the accompanying drawings.

In the drawings, the thicknesses or sizes of respective layers are exaggerated, omitted, or schematically illustrated for convenience and clarity of description. Therefore, the sizes or areas of respective elements do not denote the actual sizes or areas thereof.

Hereinafter, light emitting devices in accordance with embodiments will be described with reference to the accompanying drawings.

FIG. 1 is a schematic cross-sectional view of a light emitting device in accordance with one embodiment.

With reference to FIG. 1, a light emitting device 100 in accordance with this embodiment includes a support member 110, an undoped GaN layer 120 formed on the support member 110, and a light emitting structure 130 formed on the undoped GaN layer 120 and including a first semiconductor layer 131, an active layer 132 and a second semiconductor layer 133. The active layer 132 includes a potential barrier layer 134 and a first undoped barrier layer 135.

The support member 110 may be made of a light transmitting material, for example one of sapphire ($Al_2O_3$), GaN, ZnO and AlO, but is not limited thereto. Further, the support member 110 may be made of SiC having heat conductivity greater than that of sapphire ($Al_2O_3$). In order to increase light extraction efficiency, the support member 110 preferably has a refractive index that is less than that of the first semiconductor layer 131.

A Patterned Sapphire Substrate (PSS) structure may be provided on the upper surface of the support member 110 in order to increase light extraction efficiency. The support member 110 referred to in the present embodiment may or may not include the PSS structure.

After manufacture of the light emitting device, the support member 110 may be replaced by a silicon material having excellent thermal conductivity through a process, such as a flip chip bonding process. In this embodiment, the support member 110 made of sapphire ($Al_2O_3$) will be described. Therefore, the support member 110 may be a sapphire substrate. In order to increase light extraction efficiency, the support member 110 preferably has a refractive index that is less than that of the first semiconductor layer 131.

A buffer layer 112 to decrease lattice mismatch between the support member 110 and the first semiconductor layer 131 and to allow the first semiconductor layer 131 to be easily grown on the support member 110 may be located on the support member 110. The buffer layer 112 may be formed under a low-temperature atmosphere and may be made of one material out of GaN, InN, AlN, AlInN, InGaN, AlGaN and InAlGaN.

The buffer layer 112 may be grown on the support member 110 as a single crystal, and the buffer layer 112 grown as the single crystal may improve crystallinity of the first semiconductor layer 131 grown on the buffer layer 112.

The undoped GaN layer 120 is formed on the buffer layer 112.

The undoped GaN layer 120 is formed so as to improve crystallinity of the first semiconductor layer 131. The undoped GaN layer 120 is the same as the first semiconductor layer 131 except that the undoped GaN layer 120 is not doped with an N-type dopant and thus has electrical conductivity lower than that of the first semiconductor layer 131.

An insertion layer 122 to minimize lattice mismatch of the first semiconductor layer 131 is formed on the undoped GaN layer 120.

That is, the insertion layer 122 serves as a quality control layer, and may be made of AlGaN or AlGaN to which indium (In) is added.

The light emitting structure 130 including the first semiconductor layer 131, the active layer 132 and the second semiconductor layer 133 is formed on the insertion layer 122.

Hereinafter, the light emitting structure 130 will be described as including the first semiconductor layer 131, the second semiconductor layer 133 and the active layer 132 interposed between the first semiconductor layer 131 and the second semiconductor layer 133 to generate light.

The first semiconductor layer 131 is formed on the insertion layer 122. For example, the first semiconductor layer 131 may be an N-type semiconductor layer, and the N-type semiconductor layer may be made of a semiconductor material having the formula $In_xAl_yGa_{1-x-y}N$ ($0 \leq x \leq 1$, $0 \leq y \leq 1$, $0 \leq x+y \leq 1$, for example one selected from GaN, AlN, AlGaN, InGaN, InN, InAlGaN and AlInN, and be doped with an N-type dopant, such as Si, Ge, Sn, Se or Te.

The active layer 132 is formed on the first semiconductor layer 131.

The active layer 132 may be formed in a single quantum or multi-quantum well structure, a quantum wire structure or a quantum dot structure using a group III-V compound semiconductor material. Process conditions for growth of the active layer 132 are as follows. For example, the active layer 132 made of InGaN is grown to a thickness of 120 Å to 1,200 Å by supplying $NH_3$, TMGa and TMIn onto the first semiconductor layer 131 at a growth temperature of 780° C. using nitrogen gas as a carrier gas. Here, the active layer 132 may have a stack structure of plural layers grown by varying a molar ratio of respective elements of InGaN.

If the active layer 132 is formed in a quantum well structure, for example, the active layer 132 may be formed in a single quantum or multi-quantum well structure having (a) well layer(s) having the formula $In_xAl_yGa_{1-x-y}N$ ($0 \leq x \leq 1$, $0 \leq y \leq 1$, $0 \leq x+y \leq 1$) and (a) barrier layer(s) having the formula $In_aAl_bGa_{1-a-b}N$ ($0 \leq a \leq 1$, $0 \leq b \leq 1$, $0 \leq a+b \leq 1$). The well layer may be made of a material having a bandgap that is less than that of the barrier layer.

A conductive clad layer (not shown) may be formed on and/or under the active layer 132. The conductive clad layer (not shown) may be made of an AlGaN-based semiconductor and have a bandgap that is greater than that of the active layer 132.

If the active layer 132 is formed in a multi-quantum well structure, the potential barrier layer 134 is formed at a region of the active layer 132 close to the first semiconductor layer 131. The potential barrier layer 134 has a potential barrier higher than those of the plural barrier layers of the active layer 132 and has resistance to carriers (for example, electrons) supplied from the first semiconductor layer 131 or ESD.

For example, the potential barrier layer 134 is formed to a thickness of 3.5~40 Å, and preferably formed to a thickness of about 10 Å. Here, the potential barrier layer 134 is preferably formed at a rate of 3.5~40 Å/m at a temperature of 700~800° C.

The potential barrier layer 134 may be formed at the region of the active layer 132 close to the first semiconductor layer 131. Further, the potential barrier layer 134 may contact the first semiconductor layer 131, replace a quantum wall layer close to the first semiconductor layer 131, be additionally formed on the quantum well layer close to the first semiconductor layer 131, or be formed at a position of a quantum well layer second closest to the first semiconductor layer 131 out of positions of quantum well layers in the active layer 132, but the position of the potential barrier layer 134 is not limited thereto.

Therefore, the potential barrier layer 134 may be formed by increasing the concentration of InN in the quantum well layers closest to the first semiconductor layer 131, or be a layer including InN separately from the quantum well layers.

Further, two or more potential barrier layers 134 according to an environment in which the light emitting device in accordance with this embodiment is used, an ESD level which may be generated by the device, or an electrostatic requirement may be formed in the active layer 132.

As the concentration of InN contained in the potential barrier layer 134 increases, resistance of the potential barrier layer 134 to traveling of carriers from the first semiconductor layer 131 to the active layer 132 tends to increase. If the potential barrier layer 134 containing InN is sufficiently thin, the carriers are properly spread by the potential barrier layer 134 and are uniformly dispersed into the active layer 132.

When the potential barrier layer 134 resists traveling of the carriers, the carriers traveling from the first semiconductor layer 131 to the active layer 132 are spread by the potential barrier layer 134. Therefore, the carriers traveling from the potential barrier layer 134 of the quantum wall layers of the active layer 132 can be uniformly distributed throughout the quantum wall layers. This increases light emission efficiency of the active layer 132, thereby improving light emission efficiency of the light emitting device 100 in accordance with this embodiment.

The potential barrier layer 134 delays and disperses ESD introduced along the first semiconductor layer 131 from a first electrode pad 142. The potential barrier layer 134 forms a potential barrier higher than those of the quantum well layers and the barrier layers forming the active layer 132, and delays a current applying velocity of ESD using the high potential barrier, thereby minimizing damage to the active layer 132.

When ESD passes through the active layer 132 along a single path for a short time, destructive power of ESD is maximized. In order to minimize ESD induced damage to the active layer 132, preferably, time during which ESD passes through the active layer 132 is maximally delayed and a plurality of paths along which ESD proceeds to the active layer 132 is provided. Therefore, the potential barrier layer 134 needs to form a potential barrier higher than the potential barriers of the quantum well layers and the barrier layers. For this purpose, the potential barrier layer 134 contains a high concentration of InN, and preferably 80% to 100%. Here, the concentration of InN may be one of a concentration of by mass, a concentration by volume and a concentration by molar ratio.

The potential barrier layer 134 may function as a resistor to ESD when ESD is applied. When ESD passes through the active layer 132, it is difficult for ESD to pass through the active layer 132 using a single path due to delay through the potential barrier layer 134 functioning as the resistor. Therefore, ESD does not travel along a single path in the potential barrier layer 134, but travels along two or more paths. When ESD travels along a plurality of paths rather than the single path, ESD induced damage to the active layer 132 may be reduced.

The first undoped barrier layer 135 is formed between the potential barrier layer 134 and the quantum well layers.

The first undoped barrier layer 135 is not doped with a P-type or N-type dopant and may thus have higher electrical resistance than that of the quantum well layers or the barrier layers doped with a P-type or N-type dopant, and is made of GaN or InGaN. The first undoped barrier layer 135 is disposed between the potential barrier layer 134 and the quantum well layers so as to prevent direct contact between the potential barrier layer 134 and the quantum well layers. The first undoped barrier layer 135 has a thickness greater than that of the potential barrier layer 134, preferably a thickness of 50 Å to 300 Å, and more preferably a thickness of 150 Å to 200 Å, thereby allowing the potential barrier layer 134 and the quantum well layers to be sufficiently separated from each other. The first undoped barrier layer 135 may have a thickness of 7.5 to 100 times that of the potential barrier layer 134.

The first undoped barrier layer 135 disposed between the potential barrier layer 134 and the quantum well layers prevents direct contact between the potential barrier layer 134 and the quantum well layers and allows the potential barrier layer 134 and the quantum well layers to be sufficiently separated from each other, thereby preventing indium nitride (InN) contained in the potential barrier layer 134 from penetrating the neighboring quantum well layers and thus raising a potential level of the quantum well layers and inducing reduction in brightness.

A potential compensation layer (not shown) may be formed in the active layer 132. The potential compensation layer (not shown) is formed at a position of the barrier layer closest to the second semiconductor layer 133 or the barrier layer second closest to the second semiconductor layer 133 out of the barrier layers of the active layer 132, for example, by doping the barrier layer with silicon (Si).

A buffer layer (not shown) may be formed on the active layer 132. The buffer layer (not shown) may have a thickness of 5 Å to 40 Å.

The second semiconductor layer 133 may be a P-type semiconductor layer so as to inject holes into the active layer 132. The second semiconductor layer 133 may be made of a semiconductor material having the formula $In_xAl_yGa_{1-x-y}N$ ($0 \leq x \leq 1$, $0 \leq y \leq 1$, $0 \leq x+y \leq 1$), for example one selected from GaN, AlN, AlGaN, InGaN, InN, InAlGaN and AlInN, and be doped with a P-type dopant, such as Mg, Zn, Ca, Sr or Ba.

The above-described first semiconductor layer 131, active layer 132, buffer layer (not shown) and second semiconductor layer 133 may be formed using various methods, such as Metal Organic Chemical Vapor Deposition (MOCVD), Chemical Vapor Deposition (CVD), Plasma-Enhanced Chemical Vapor Deposition (PECVD), Molecular Beam Epitaxy (MBE), Hybrid Vapor Phase Epitaxy (HVPE) and sputtering, but formation of the first semiconductor layer 131, the active layer 132, the buffer layer (not shown) and the second semiconductor layer 133 is not limited thereto.

Doping concentrations of the conductive dopants in the first semiconductor layer 131 and the second semiconductor layer 133 may be uniform or non-uniform. That is, the plural semiconductor layers 131 and 133 may have various doping concentrations, but are not limited thereto.

A light transmitting electrode layer 140 and a second electrode pad 144 are formed on the second semiconductor layer 133.

The light transmitting electrode layer 140 includes at least one of ITO, IZO (In—ZnO), GZO (Ga—ZnO), AZO (Al—ZnO), AGZO (Al—Ga ZnO), IGZO (In—Ga ZnO), $IrO_x$, $RuO_x$, $RuO_x$/ITO, $Ni/IrO_x$/Au and $Ni/IrO_x$/Au/ITO, and transmits light generated by the active layer 132 to the outside. Further, the light transmitting electrode layer 140 is formed at one region or all regions on the upper surface of the second semiconductor layer 133, thereby preventing current crowding.

The second electrode pad 144 may be formed on the upper surface of the light transmitting electrode layer 140 or be formed by forming an opening by removing some parts of the light transmitting electrode layer 140 such that the second electrode pad 144 contacts the second semiconductor layer 133, but formation of the second electrode pad 144 is not limited thereto.

A light extraction structure 150 is formed on the upper surface of the light emitting structure 130.

The light extraction structure 150 may be formed on the upper surface of the light transmitting electrode layer 140 formed on the light emitting structure 130 or be formed on the upper surface of the second semiconductor layer 133, but formation of the light extraction structure 150 is not limited thereto.

The light extraction structure 150 may be formed at some regions or all regions on the upper surface of the light transmitting electrode layer 140 or the second semiconductor layer 133. The light extraction structure 150 is formed by performing an etching process upon at least one region of the upper surface of the light transmitting electrode layer 140 or the second semiconductor layer 133. Such an etching process includes a wet and/or dry etching process(es). Through the etching process, the upper surface of the light transmitting electrode layer 140 or the upper surface of the second semiconductor layer 133 has roughness forming the light extraction structure 150 having a height of 0.1 µm to 3 µm. The roughness having a random size may be irregularly formed, but is not limited thereto. The roughness means an uneven upper surface and includes at least one of a texture pattern, a concave-convex pattern and an uneven pattern.

The cross-section of the roughness may have various shapes, such as a cylinder, a polyprism, a cone, a polypyramid, a circular truncated cone and a frustum of a pyramid, and preferably has a conical or polypyramidal shape.

The light extraction structure 150 may be formed by a Photo-Electro Chemical (PEC) method, but formation of the light extraction structure 150 is not limited thereto. When the light extraction structure 150 is formed on the upper surface of the light transmitting electrode layer 140 or the second semiconductor layer 133, re-absorption of light generated by the active layer 132 into the active layer 132 or scattering of the light due to total reflection of the light by the upper surface of the light transmitting electrode layer 140 or the second semiconductor layer 133 is prevented, thereby contributing to improvement of light extraction efficiency of the light emitting device 100.

Some regions of the first semiconductor layer 131 are exposed by removing some regions of the active layer 132 and the second semiconductor layer 133, and the first electrode pad 142 is formed on the upper surface of the first semiconductor layer 131 in the exposed region. That is, the fist semiconductor layer 131 is provided with the upper surface facing the active layer 132 and the lower surface facing the support member 110, the upper surface of the first semiconductor layer 131 includes the exposed regions, and the first electrode pad 142 is disposed in the exposed regions of the upper surface of the first semiconductor layer 131

Exposure of some regions of the first semiconductor layer 131 may be carried out using a specific etching method, but is not limited thereto. As the etching method, the wet etching method or the dry etching method may be used.

The first and second electrode pads 142 and 144 may be made of a conductive material, for example, one selected from In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or an alloy thereof, and be formed in a single layer or multi-layer structure. However, the formation of the first and second electrode pads 142 and 144 is not limited thereto.

Figure 2:
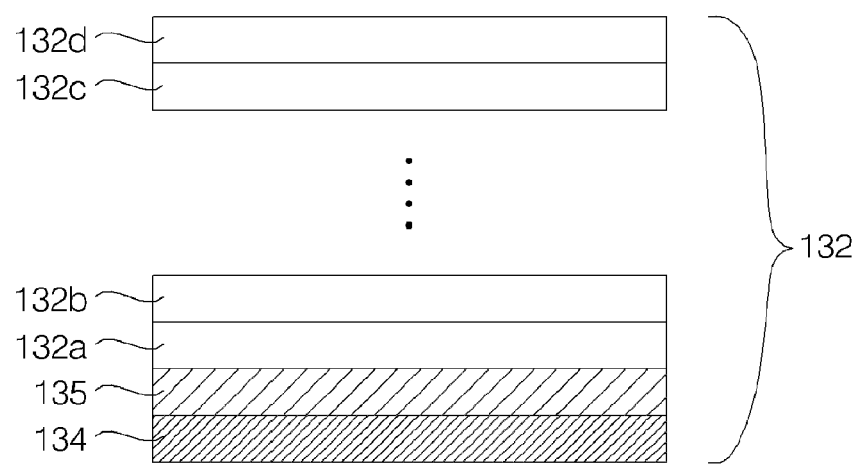
FIG. 2 is a detailed cross-sectional view illustrating an active layer of FIG. 1.

FIG. 2 is a cross-sectional view illustrating the active layer of FIG. 1 in detail.

With reference to FIG. 2, the active layer 132 includes a plurality of quantum well layers 132a and 132c, a barrier layer 132b, the potential barrier layer 134 and the first undoped barrier layer 135.

Although FIG. 2 illustrates two quantum well layers 132a and 132c, the number of the quantum well layers may be three, four or more. In the same manner, the number of the barrier layers 132b formed alternately with the quantum well layers 132a and 132c may be determined based on the number of the quantum well layers.

In order to disperse carriers or ESD proceeding from the first semiconductor layer 131 to the active layer 132 or to reduce a proceeding velocity thereof, the potential barrier layer 134 is preferably formed closer to the first semiconductor layer 131 than to the second semiconductor layer 133. If another potential barrier layer is further provided in the active layer 132, the potential barrier layer may be additionally located at the position of the quantum well layer 132c, but the position of the additional potential barrier layer is not limited thereto.

The first undoped barrier layer 135 is formed between the first quantum well layer 132a closest to the first semiconductor layer 131 and the potential barrier layer 134. Thereby, the first undoped barrier layer 135 isolates the potential barrier layer 134 and the quantum well layers 132a and 132c from each other. If a high concentration of InN contained in the potential barrier layer 134 penetrates the quantum well layers 132a and 132c, a potential level of the quantum well layers 132a and 132c becomes similar to a potential level of the barrier layer 132b and thus the quantum well layers 132a and 132c may not generate a sufficient amount of light. Therefore, the first undoped barrier layer 135 may have a sufficient thickness so as to prevent InN contained in the potential barrier layer 134 from penetrating the quantum well layers 132a and 132c. The first undoped barrier layer 135 preferably has a thickness of 50 Å to 300 Å.

The first undoped barrier layer 135 is made of the same material as the other barrier layer 132b forming the active layer 132. However, in order to prevent InN from penetrating the quantum well layers 132a and 132c, the first undoped barrier layer 135 has a thickness of 1.5 to 7.5 times that of the barrier layer 132b.

Figure 3:
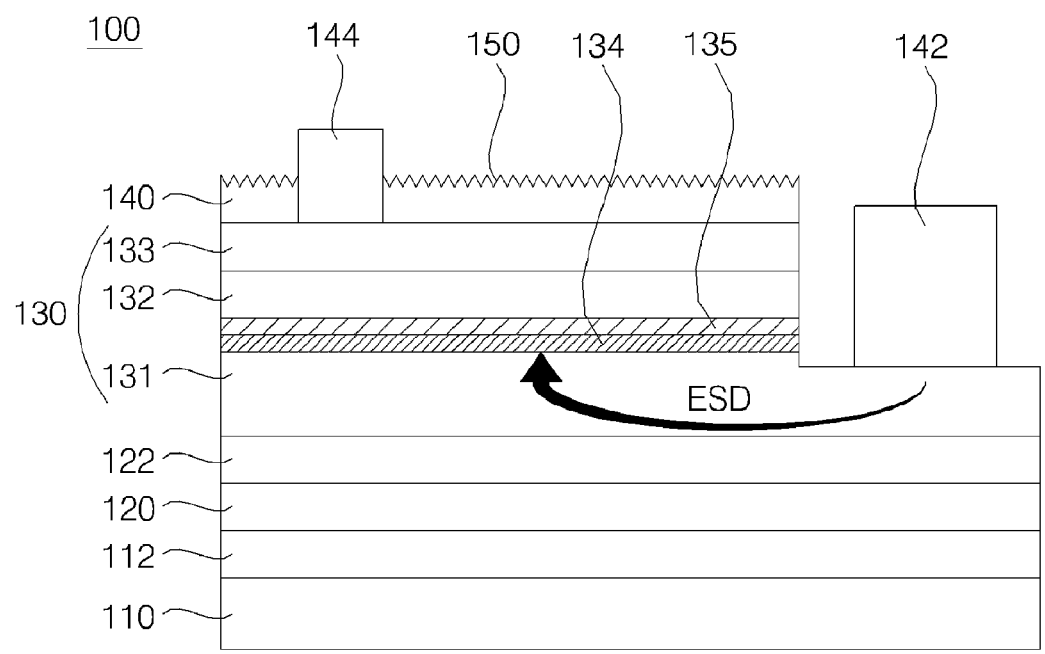
FIG. 3 is a reference view illustrating a moving path of ESD.

FIG. 3 is a reference view illustrating a moving path of ESD.

With reference to FIG. 3, ESD is introduced into the light emitting device 100 through the first electrode pad 142 to which external voltage is applied, and proceeds from the first electrode pad 142 to the active layer 132 via the first semiconductor layer 131.

When ESD is introduced into the light emitting device 100 through the first electrode pad 142, if ESD is concentrated upon one region of the active layer 132, damage to the active layer 132 may be increased, and if ESD is not concentrated upon one region of the active layer 132, damage to the active layer 132 may be decreased.

The first semiconductor layer 131 serves as a channel for drive power applied through the first electrode pad 142, and thus has no resistance to ESD, and the potential barrier of the barrier layer forming the active layer 132 is weak against ESD. Therefore, in addition to the first semiconductor layer 131, a separate layer (not shown) is preferably formed so as to change the moving path of ESD and to spread ESD without concentration of ESD.

When ESD is generated and introduced into the active layer 132, the most proper region to block ESD corresponds to a region between the active layer 132 and the first semiconductor layer 131. However, if a separate layer to resist ESD is formed in such a region, introduction of carriers into the active layer 132 is reduced and thus brightness of the active layer 132 may be reduced.

Therefore, the potential barrier layer 134 needs to have a small thickness and be formed as close as possible to the quantum well layers. Preferably, the potential barrier layer 134 is embedded in the active layer 132, as described in the above embodiment.

Figure 4:
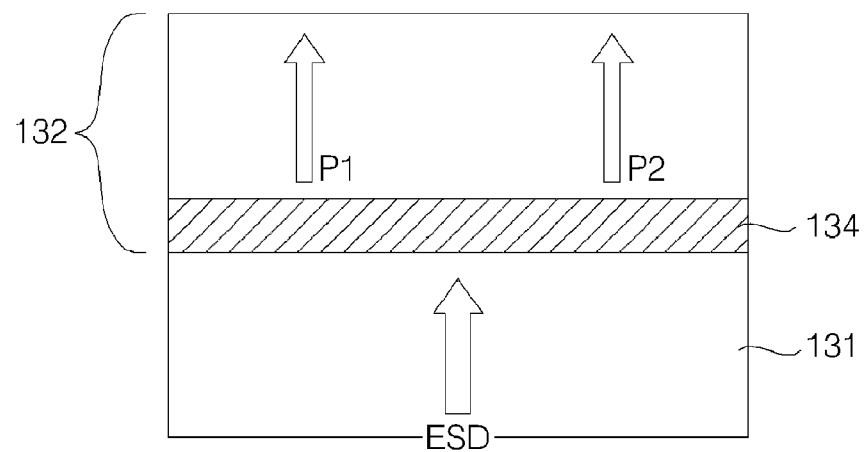
FIGS. 4 and 5 are reference views illustrating methods of dispersing ESD in accordance with embodiments.
Figure 5:
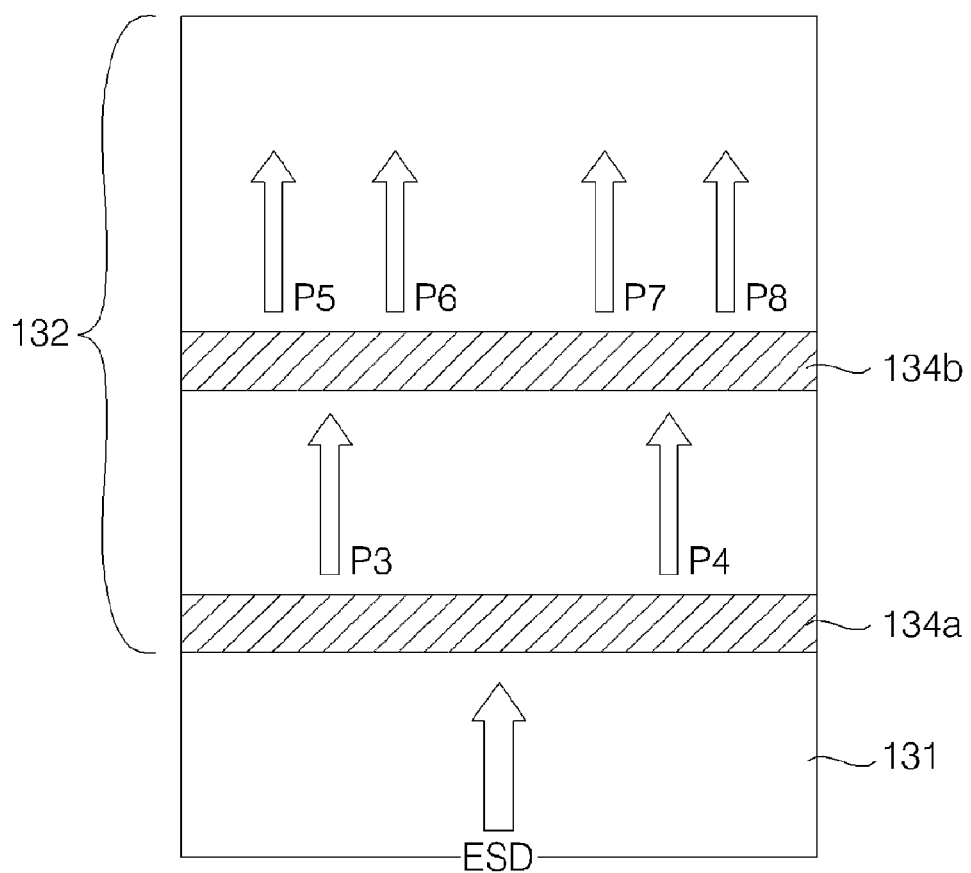

FIGS. 4 and 5 are reference views illustrating principles of dispersing ESD in accordance with embodiments First, FIG. 4 is a reference view illustrating a method of dispersing ESD if one potential barrier layer 134 is formed in the active layer 132. With reference to FIG. 4, when ESD proceeds from the first semiconductor layer 131 to the active layer 132, the potential barrier layer 134 resists ESD and reduces a proceeding velocity of ESD, thereby dividing the initial passing path of ESD into plural paths.

As shown in FIG. 4, ESD proceeds along two paths P1 and P2 divided by the potential barrier layer 134. ESD proceeding along the two divided paths P1 and P2 has reduced destructive power when ESD enters the active layer 132, as compared with ESD proceeding along a single path. FIG. 4 illustrates that ESD proceeds along the two paths P1 and P2. However, the two paths P1 and P2 are conceptually illustrated, but FIG. 4 does not denote that ESD is actually along only two paths P1 and P2. That is, the paths of ESD may be provided in plural number which is not limited.

Next, FIG. 5 is a reference view illustrating a method of dispersing ESD if two potential barrier layers 134a and 134b are formed in the active layer 132.

With reference to FIG. 5, the initial path of ESD is divided into two paths P3 and P4 by the first potential barrier layer 134a and then the two paths P3 and P4 are again divided into four paths P5, P6, P7 and P8 by the second potential barrier layer 134b.

The initial path of ESD is divided into plural paths P3 to P8 by the two potential barrier layers 134a and 134b, and destructive power of ESD proceeding along each divided path is significantly lowered, as compared with ESD proceeding along a single path. Here, although FIG. 5 illustrates two potential barrier layers 134a and 134b, the number of potential barrier layers may be two, three or more. However, if the number of the potential barrier layers is continuously increased so as to increase the number of the paths of ESD, movement of carriers proceeding from the first semiconductor layer 131 to the quantum well layers in the active layer 132 may be restricted and brightness may be lowered due to replacement of the quantum well layers in the active layer 132 with the potential barrier layers. Therefore, the number of the potential barrier layers (for example, the two potential barrier layers 134a and 134b) replacing the quantum well layers in the active layer 132 is preferably determined based on brightness and a level of ESD tolerance required by the light emitting device in accordance with this embodiment.

Further, FIG. 5 illustrates that the initial path of ESD is finally divided into the four paths P5 to P8 by the two potential barrier layers 134a and 134b. However, the four paths P5 to P8 are conceptually illustrated, but the number of the divided paths is not limited thereto. That is, the paths P5 to P8 of ESD shown in FIG. 5 means that the number thereof is greater than the number of the paths P1 and P2 of ESD shown in FIG. 4.

Figure 6:
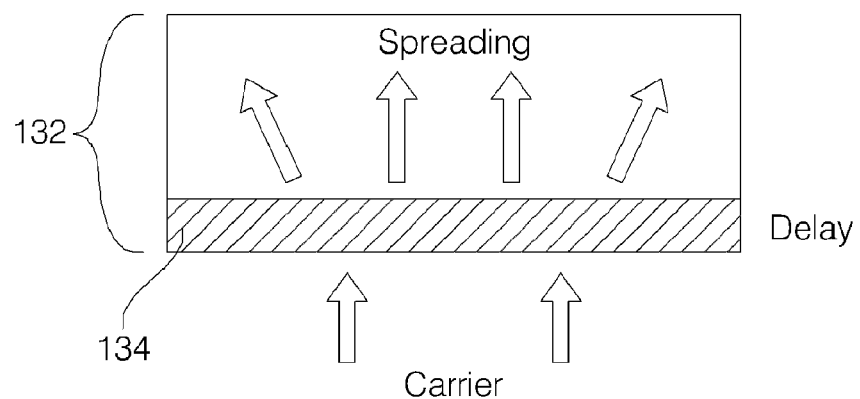
FIG. 6 is a conceptual view illustrating a method of diffusing carriers by means of a potential barrier layer.

FIG. 6 is a conceptual view illustrating a method of spreading carriers by means of the potential barrier layer.

With reference to FIG. 6, the potential barrier layer 134 forms a potential barrier to ESD or carriers proceeding to the active layer 132 through the first semiconductor layer 131.

The potential barrier layer 134 causes the carriers to proceed to the active layer 132 along plural paths without applying of the carriers directly to the active layer 132. The potential barrier layer 134 causes delay of time during which the carriers proceed, and the delay of the proceeding time of the carriers allows the carriers to be uniformly dispersed along different paths.

The carriers spread by the potential barrier layer 134 are uniformly dispersed throughout the active layer 132 and thus uniformly dispersed throughout the quantum well layers of the active layer 132, thereby increasing light emission efficiency of the active layer 132.

Figure 7:
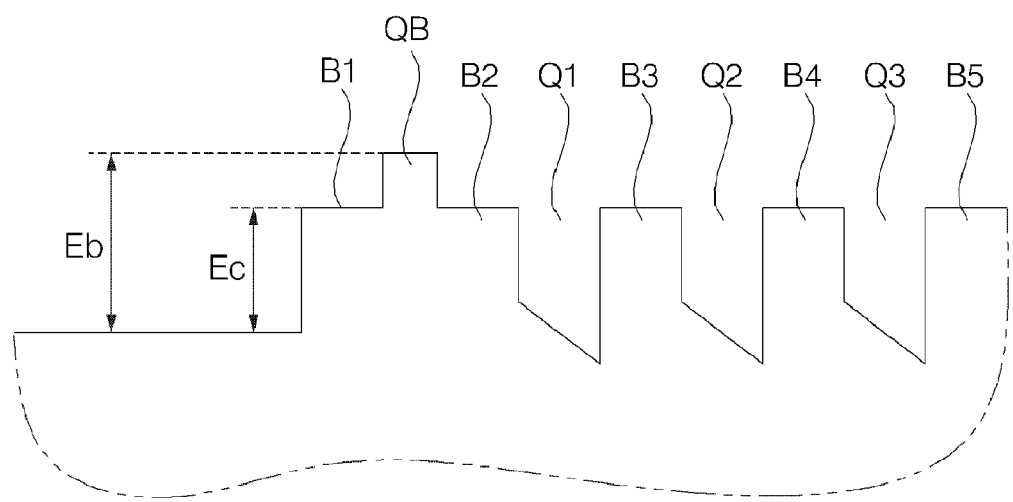
FIG. 7 is a conceptual view illustrating potential barriers of the active layer.

FIG. 7 is a conceptual view illustrating potential barriers of an active layer.

With reference to FIG. 7, a potential barrier Eb of an active layer QB is set to be higher than a potential barrier Ec of barrier layers B1 and B2. For example, if a light emitting device emits blue light, quantum well layers Q1, Q2 and Q3 are made of InGaN and the barrier layers B1 and B2 are made of GaN, and thus a bandgap of the barrier layers B1 and B2 is higher than that of the quantum well layers Q1, Q2 and Q3. Here, materials for the barrier layers B1 and B2 and the quantum well layers Q1, Q2 and Q3 may be selected such that the bandgap of the barrier layers B1 and B2 is higher than that of the quantum well layers Q1, Q2 and Q3 and detailed compositions thereof may be varied according to a wavelength of light to be emitted, but materials for the barrier layers B1 and B2 and the quantum well layers Q1, Q2 and Q3 and compositions thereof are not limited thereto.

The potential barrier layer QB may be made of a material having a higher bandgap than that of the barrier layers B1 and B2. For example, the potential barrier layer QB contains InN, as described above, and the concentration of InN in the potential barrier layer QB is preferably 80% to 100%. Here, the concentration of InN may be one of a concentration by mass, a concentration by volume and a concentration by molar ratio.

If carriers are holes, the carriers proceed from a right position, as seen from FIG. 7, to the quantum well layers Q1, Q2 and Q3 and thus the potential barrier layer QB has no resistance to the carriers (holes). The potential barrier layer QB is formed close to the first semiconductor layer 131 and thus has resistance to ESD.

Since ESD is blocked by the potential barrier of potential barrier layer QB, time during which ESD passes through the potential barrier layer QB is delayed. Such time delay allows ESD to be dispersed throughout the active layer 132 and prevents ESD from rapidly entering the quantum well layers Q1 and Q2 and Q3, thereby reducing loss of the quantum well layers Q1 and Q2 and Q3.

Figure 8:
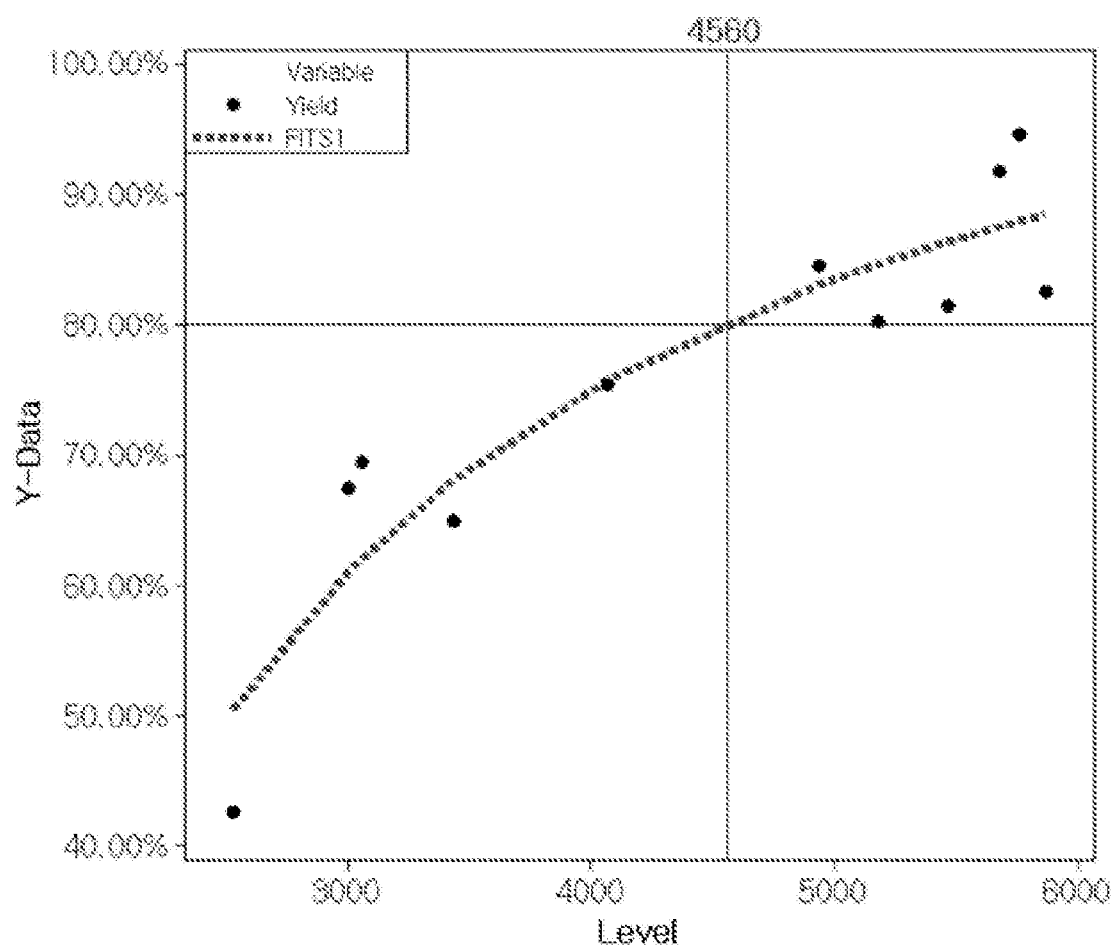
FIG. 8 is a graph illustrating relations between ESD and yield of the light emitting device.

FIG. 8 is a graph illustrating relations between ESD and yield of the light emitting device.

With reference to FIG. 8, the horizontal axis of the graph represents voltage values of ESD applied to the light emitting device and the vertical axis of the graph represents yield.

In general, light emitting devices which are collectively manufactured on the same line are regarded as having the same properties. If a sampling test of some of the light emitting devices (or a test of all the light emitting devices) is performed, when an ESD voltage which the respective light emitting devices withstand is −4,560V, yield of the total light emitting devices reach about 80%.

As the ESD withstand voltage of the light emitting devices decreases, yield decreases.

As seen from the graph, it is understood that when the light emitting devices have ESD tolerance of about −3,000V, yield of the light emitting devices is less than 60%.

Figure 9A:
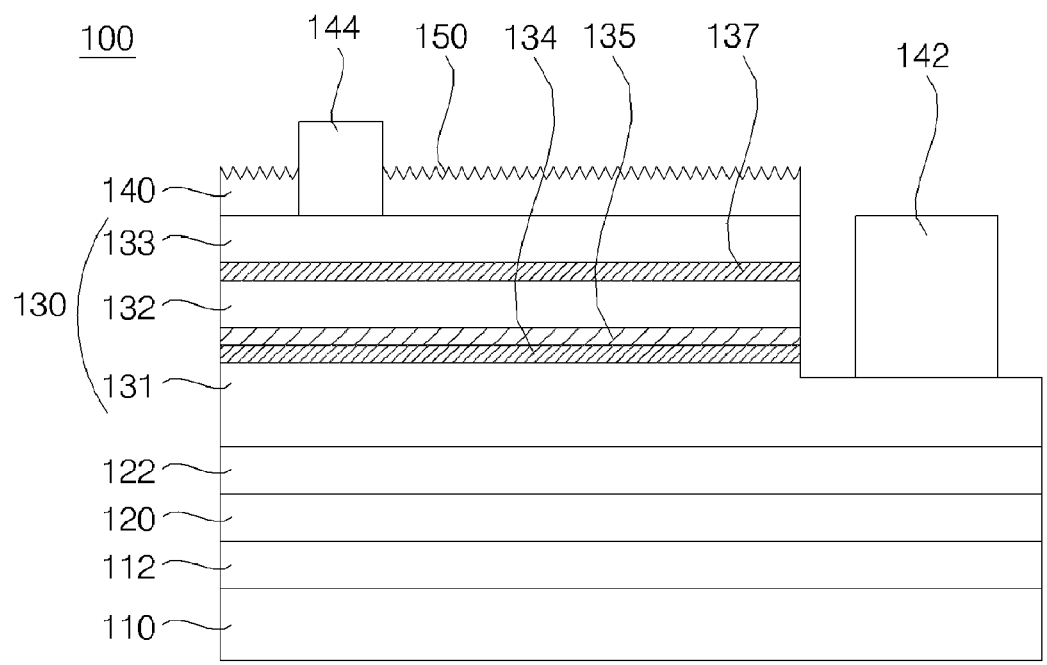
FIG. 9A is a cross-sectional view of a light emitting device in accordance with another embodiment.
Figure 9B:
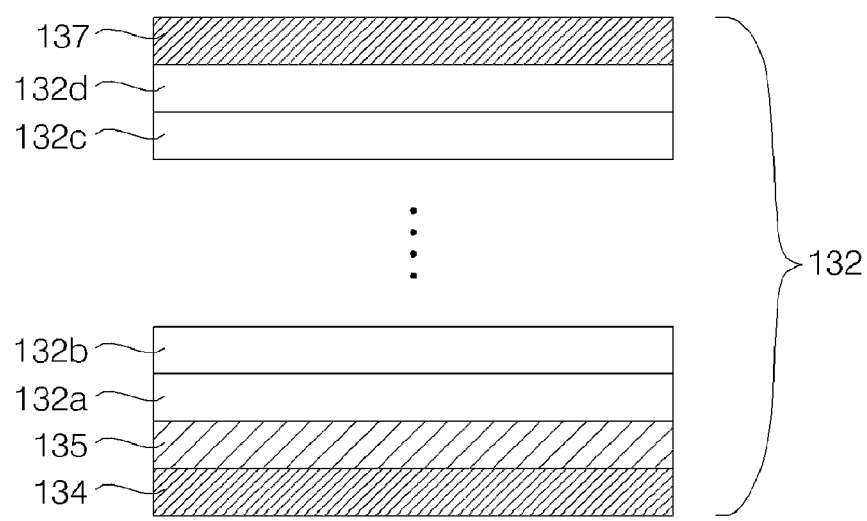
FIG. 9B is a detailed cross-sectional view illustrating an active layer of FIG. 9A.

FIG. 9A is a cross-sectional view of a light emitting device in accordance with another embodiment and FIG. 9B is a detailed cross-sectional view illustrating an active layer of FIG. 9A.

With reference to FIGS. 9A and 9B, a light emitting device 100 in accordance with this embodiment includes a support member 110, an undoped GaN layer 120 formed on the support member 110, and a light emitting structure 130 formed on the undoped GaN layer 120 and including a first semiconductor layer 131, an active layer 132 and a second semiconductor layer 133. The active layer 132 includes a potential barrier layer 134, a first undoped barrier layer 135 and a potential compensation layer 137.

A buffer layer 112 is formed on the support member 110, a light transmitting electrode layer 140, a light extraction structure 150 and a second electrode pad 144 are formed on the second semiconductor layer 133. Some regions of the first semiconductor layer 131 are exposed by removing some regions of the active layer 132 and the second semiconductor layer 133, and a first electrode pad 142 is formed on the upper surface of the first semiconductor layer 131 in the exposed regions.

The support member 110, the buffer layer 112, the undoped GaN layer 120, the first semiconductor layer 131, the active layer 132, the second semiconductor layer 133, the potential barrier layer 134, the first undoped barrier layer 135, the light emitting electrode layer 140, the light extraction structure 150 and the first and second electrode pads 142 and 144 of this embodiment are substantially equal to those of the former embodiment, and a detailed description thereof will thus be omitted.

The active layer 132 further includes the potential compensation layer 137 formed in the active layer 132.

The potential barrier layer 134 and the first undoped barrier layer 135 may function as resistors to drive voltage applied through the first and second electrode pads 142 and 144. Loss of forward voltage Vf by the potential barrier layer 134 and the first undoped barrier layer 135 requires increase of overall drive voltage of the light emitting device 100.

In order to increase light emission efficiency of the active layer 132 while maintaining sufficient tolerance to ESD without increase of the drive voltage of the light emitting device 100, the active layer 132 further includes the potential compensation layer 137.

The potential compensation layer 137 is formed at a position of a barrier layer 132d closest to the second semiconductor layer 133 or a barrier layer 132b second closest to the second semiconductor layer 133 out of barrier layers 132b and 132d of the active layer 132 by doping the barrier layer with one of group IV elements, such as C, Si, Ge and Sn. The potential compensation layer 137 improves flatness of the barrier layers 132b and 132d and lowers an inner electric field.

This embodiment illustrates application of Si out of group IV elements to the potential compensation layer 137.

The low inner electric field of the potential compensation layer 137 offsets forward voltage Vf drop by the potential barrier layer 134 and the first undoped barrier layer 135, thereby preventing increase of the forward voltage Vf of the light emitting device 100 of this embodiment due to the potential barrier layer 134 and the first undoped barrier layer 135.

The potential compensation layer 137 may have a thickness which is similar or equal to that of the barrier layers 132b and 132d of the active layer 132 and is less than that of the first undoped barrier layer 135. Preferably, the potential compensation layer 137 has a thickness of 30~150 Å.

The potential compensation layer 137 is formed at a region close to the second semiconductor layer 133. The potential compensation layer 137 increases flatness of the barrier layers 132b and 132d at the atomic level through doping using silicon (Si) and lowers resistance generated by the barrier layers 132b and 132d, thereby lowering the internal electric field. Further, the potential compensation layer 137 may be formed in the active layer 132 or be separately formed between the active layer 132 and the second semiconductor layer 133, and compensate for loss of the forward voltage Vf due to the potential barrier layer 134 and the first undoped barrier layer 135.

By increasing the concentration of In contained in the potential compensation layer 137 and increasing the thickness of the potential compensation layer 137, lowering of injection efficiency of carriers, such as holes, may be compensated for.

Figure 10A:
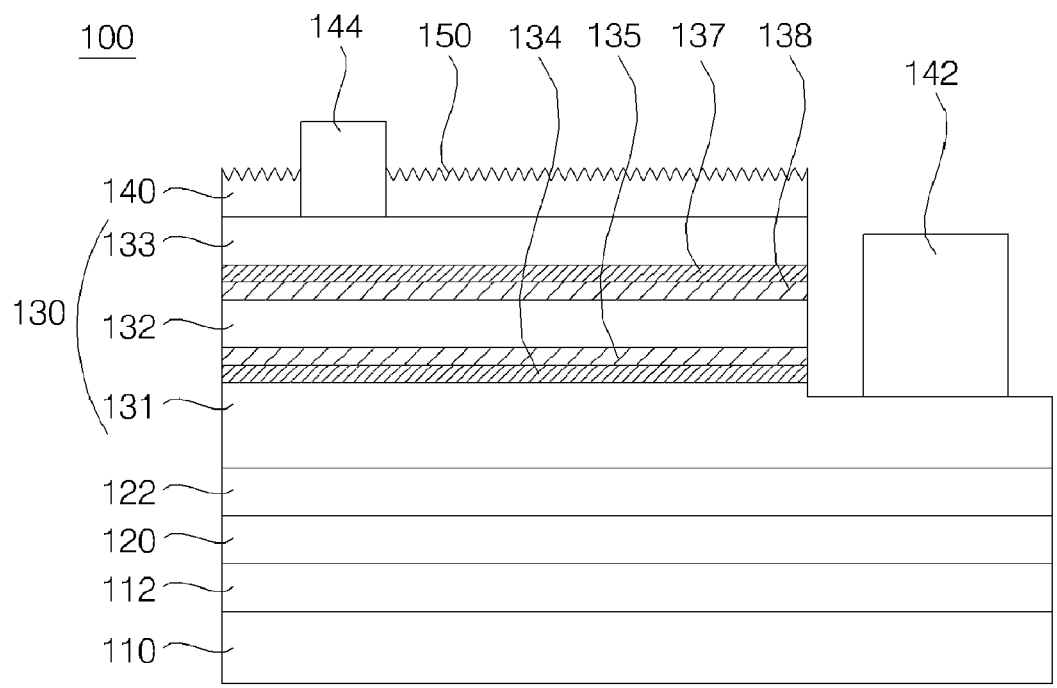
FIG. 10A is a cross-sectional view of a light emitting device in accordance with another embodiment.
Figure 10B:
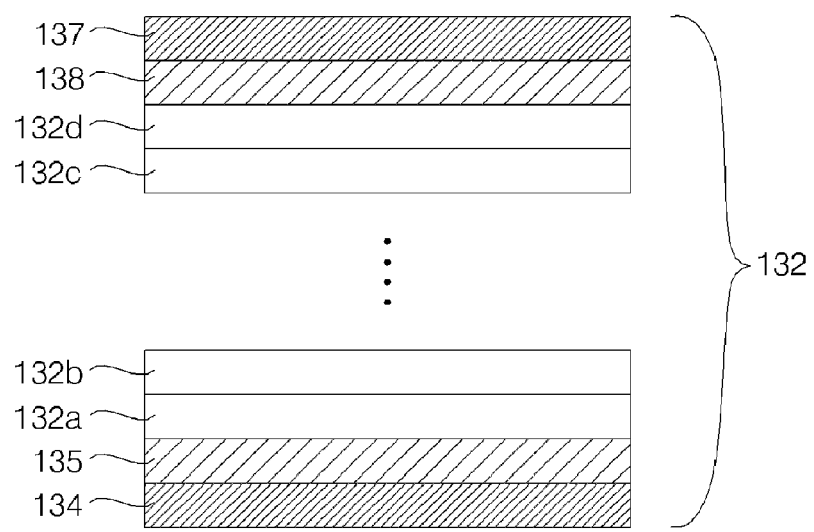
FIG. 10B is a detailed cross-sectional view illustrating an active layer of FIG. 10A.

FIG. 10A is a cross-sectional view of a light emitting device in accordance with another embodiment and FIG. 10B is a detailed cross-sectional view illustrating an active layer of FIG. 10A.

With reference to FIGS. 10A and 10B, a light emitting device 100 in accordance with this embodiment includes a support member 110, an undoped GaN layer 120 formed on the support member 110, and a light emitting structure 130 formed on the undoped GaN layer 120 and including a first semiconductor layer 131, an active layer 132 and a second semiconductor layer 133. The active layer 132 includes a potential barrier layer 134, a first undoped barrier layer 135, a potential compensation layer 137 and a second undoped barrier layer 138.

The second undoped barrier layer 138 is formed under the potential compensation layer 137.

The second undoped barrier layer 138 may be made of the same material as the above-described first undoped barrier layer 135. That is, the second undoped barrier layer 138 may be made of undoped GaN or InGaN so as to have a higher electrical resistance than that of quantum well layers or barrier layers, which are doped with a P-type or N-type dopant.

The second undoped barrier layer 138 is disposed between a second quantum well layer 132c closest to the second semiconductor layer 133 and the potential compensation layer 137, thereby preventing direct contact between the potential compensation layer 137 and the quantum well layers 132a and 132c.

The second undoped barrier layer 138 disposed between the potential compensation layer 137 and the second quantum well layer 132c prevents direct contact between the potential compensation layer 137 and the quantum well layers 132a and 132c and allows the potential compensation layer 137 and the quantum well layers 132a and 132c to be sufficiently separated from each other, thereby preventing indium nitride (InN) contained in the potential compensation layer 137 from penetrating the neighboring quantum well layers 132a and 132c and thus preventing raise of a potential level of the quantum well layers 132a and 132c and reduction in brightness.

Although the above embodiments exemplarily illustrate horizontal light emitting devices, these embodiments may be applied to vertical light emitting devices or flip chip light emitting devices.

Figure 11A:
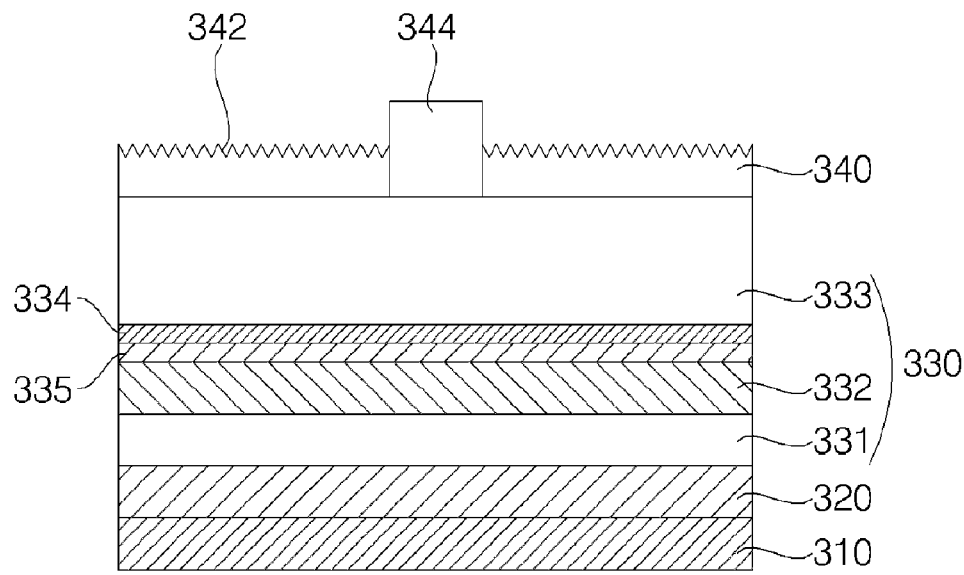
FIGS. 11A to 11C are cross-sectional views of light emitting devices in accordance with embodiments.
Figure 11B:
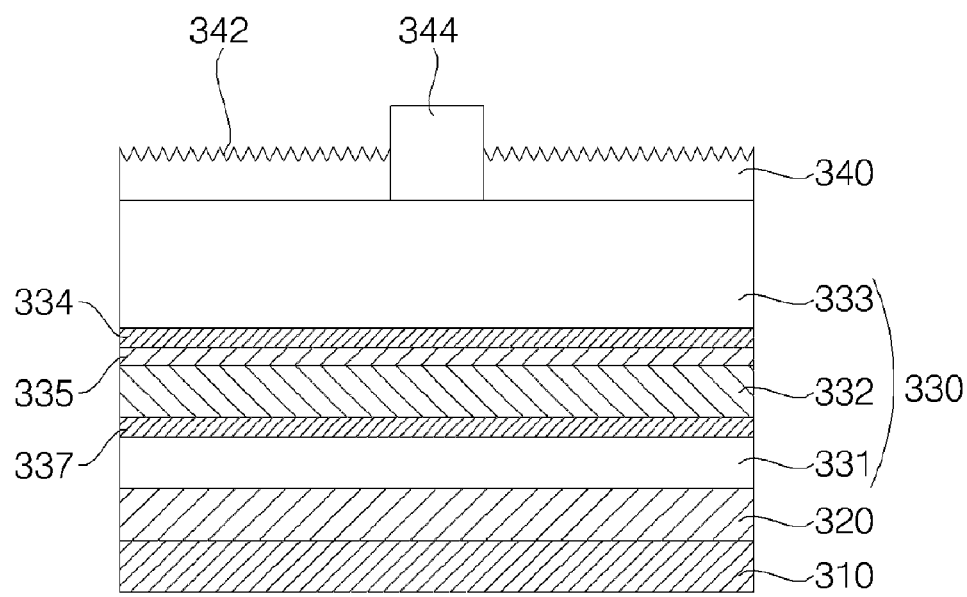
Figure 11C:
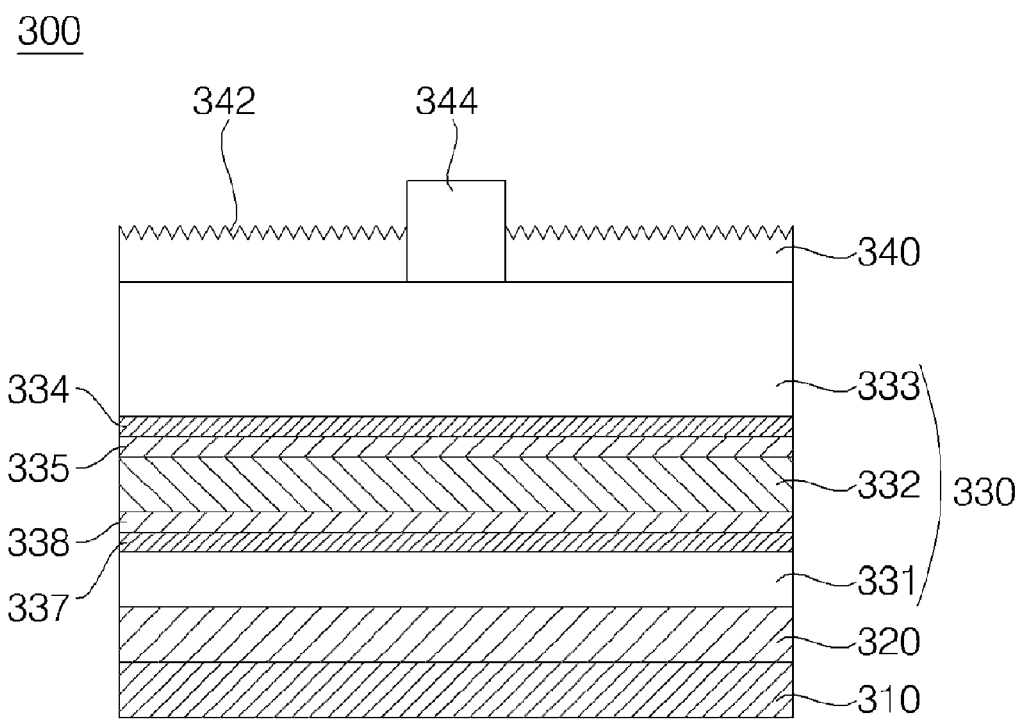
Figure 12A:
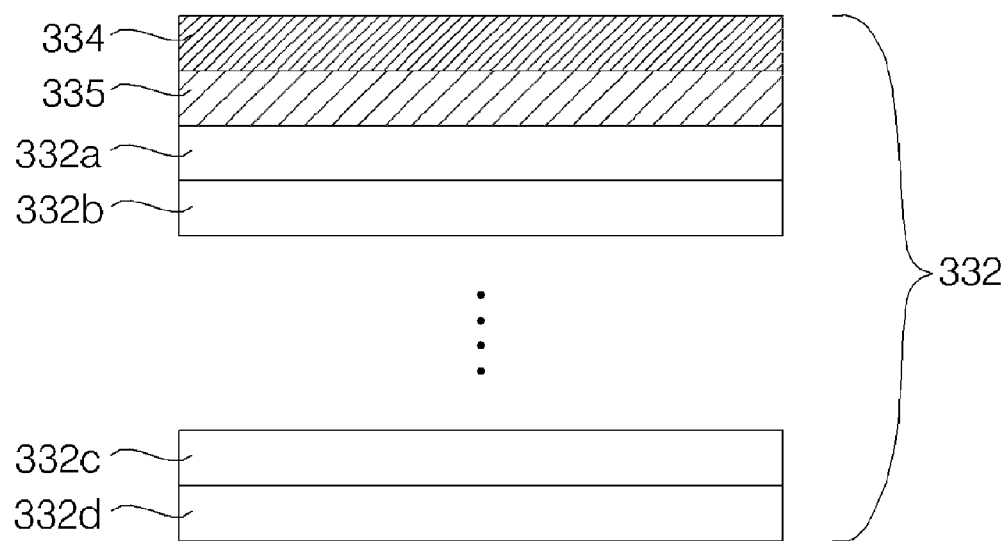
FIGS. 12A to 12C are detailed cross-sectional views respectively illustrating active layers of FIGS. 11A to 11C.
Figure 12B:
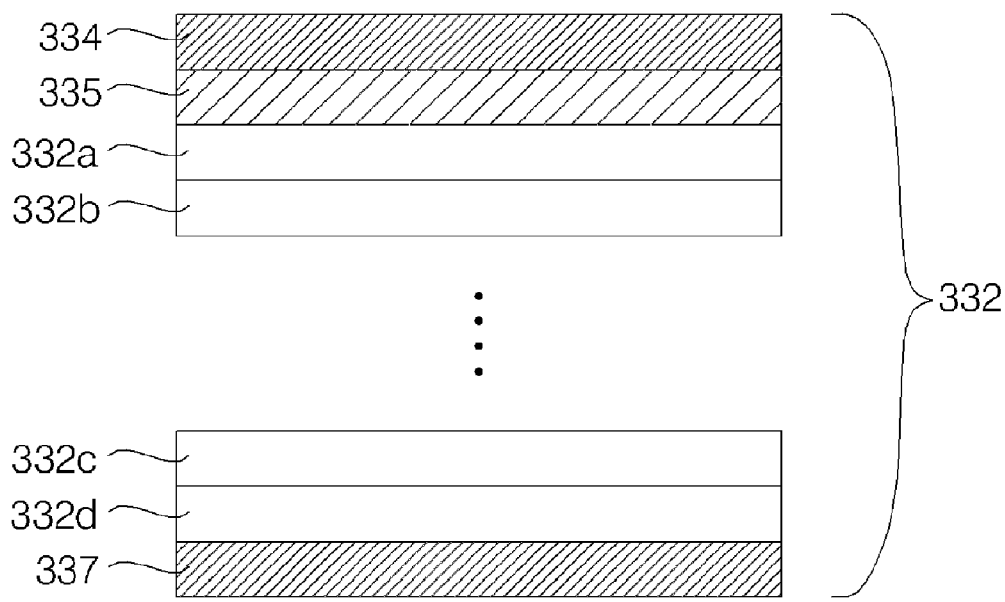
Figure 12C:
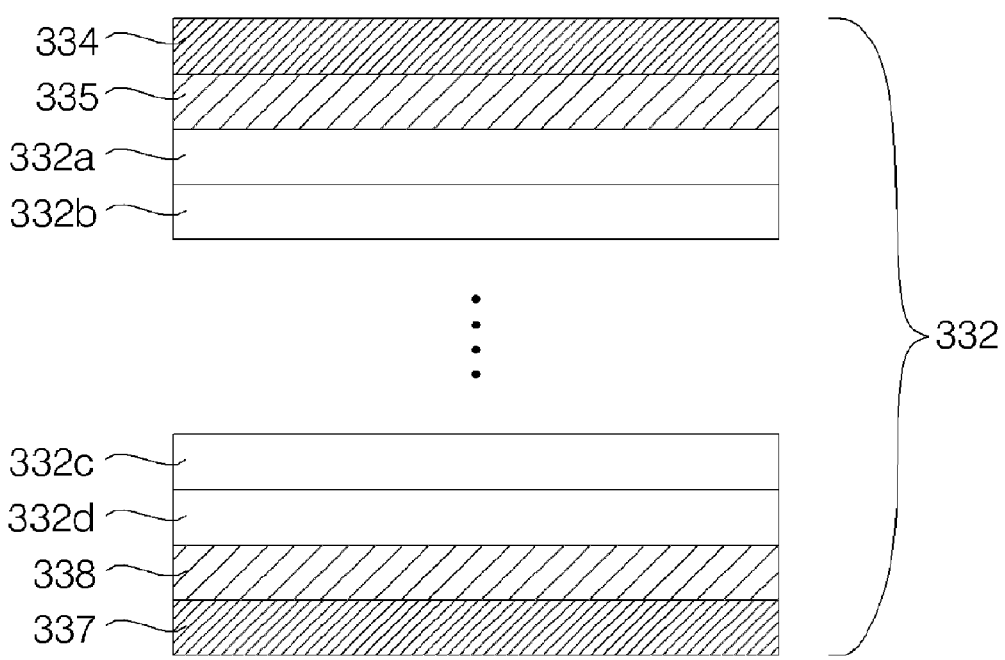

FIGS. 11A, 11B and 11C are cross-sectional views of light emitting devices in accordance with embodiments and FIGS. 12A, 12B and 12C are detailed cross-sectional views respectively illustrating active layers of the light emitting devices shown in FIGS. 11A to 11C.

With reference to FIGS. 11A to 12C, a light emitting device 300 in accordance with each of the embodiments includes a support member 310, a first electrode layer 320 formed on the support member 310, a light emitting structure 330 formed on the first electrode layer 320 and including a first semiconductor layer 331, an active layer 332 and a second semiconductor layer 333, and a second electrode layer 344 formed on the second semiconductor layer 333. The active layer 332 includes a potential barrier layer 334 and a first undoped barrier layer 335.

The support member 310 may be made of a material having excellent thermal conductivity or a conductive material, or be a support plate made of a metal or a conductive ceramic. The support member 310 may be formed in a single layer structure or a multi-layer structure including two layers or more.

That is, the support member 310 may be made of a metal, for example, one selected from Au, Ni, W, Mo, Cu, Al, Ta, Ag, Pt and Cr, or an alloy including two or more selected therefrom, or may be formed by stacking different two or more materials. Further, the support member 310 may be a carrier wafer made of Si, Ge, GaAs, ZnO, SiC, SiGe, GaN or $Ga_2O_3$.

Such a support member 310 facilitates discharge of heat generated by the light emitting device 300, thereby improving thermal stability of the light emitting device 300.

The first electrode layer 320 is formed on the support member 310. The first electrode layer 320 includes at least one of an Ohmic layer (not shown), a reflective layer (not shown) and a bonding layer (not shown). For example, the first electrode layer 320 may be formed in an Ohmic layer/reflective layer/bonding layer stack structure, an Ohmic layer/reflective layer stack structure or a reflective layer (including an Ohmic contact material)/bonding layer stack structure, but is not limited thereto. For example, the first electrode layer 320 may be formed in a structure that a reflective layer and an Ohmic layer are sequentially stacked on an insulating layer.

The reflective layer (not shown) is disposed between the Ohmic layer (not shown) and the insulating layer (not shown), and may be made of a material having excellent reflectivity, for example, one selected from Ag, Ni, Al, Rh, Pd, Ir, Ru, Mg, Zn, Pt, Au and Hf or a selective combination thereof, or be formed in a multi-layer structure using the above material and a light emitting conductive material out of IZO, IZTO, IAZO, IGZO, IGTO, AZO and ATO. Further, the reflective layer (not shown) may be formed in an IZO/Ni stack structure, an AZO/Ag stack structure, an IZO/Ag/Ni stack structure or an AZO/Ag/Ni stack structure. Further, if the reflective layer (not shown) is made of a material which comes into Ohmic contact with the light emitting structure 330 (for example, the first semiconductor layer 331), the Ohmic layer (not shown) may be omitted, but the reflective layer (not shown) is not limited thereto.

The Ohmic layer (not shown) comes into Ohmic contact with the lower surface of the light emitting structure 330, and is formed as a layer or a plurality of patterns. The Ohmic layer (not shown) may be made of a light emitting conductive layer and metal, selectively. For example, the Ohmic layer (not shown) may be formed in a single layer structure or a multi-layer structure using at least one selected from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Ni/$IrO_x$/Au and Ni/$IrO_x$/Au/ITO. The Ohmic layer (not shown) serves to facilitate injection of carriers into the first semiconductor layer 331 and is not a necessity.

The first electrode layer 320 may include the bonding layer (not shown). The bonding layer (not shown) may be made of a barrier metal or a bonding metal, for example, at least one selected from Ti, Au, Sn, Ni, Cr, Ga, In, Bi, Cu, Ag and Ta, but is not limited thereto.

The light emitting structure 330 includes the first semiconductor layer 331, the active layer 332 and the second semiconductor layer 333, and the active layer 332 is formed between the first semiconductor layer 331 and the second semiconductor layer 333.

The first semiconductor layer 331 may be a P-type semiconductor layer doped with a P-type dopant and the second semiconductor layer 333 may be an N-type semiconductor layer doped with an N-type dopant. The respective P-type semiconductor layer and the N-type semiconductor layer are substantially equal to those of the former embodiments, and a detailed description thereof will thus be omitted.

Further, if the active layer 332 is formed in a multi-quantum well structure, as shown in FIGS. 11A and 12A, the potential barrier layer 334 is formed at a region close to the second semiconductor layer 333.

The potential barrier layer 334 may be formed at one region of the active layer 332 closest to the second semiconductor layer 333.

Further, the potential barrier layer 334 may be formed at a position at which a quantum wall layer 332a closest to the second semiconductor layer 333 out of a plurality quantum well layers 332a and 332c of the active layer 332 is disposed. Alternatively, the potential barrier layer 334 may be formed at a position of a quantum wall layer 332c second closest to the second semiconductor layer 333 out of the plurality quantum well layers 332a and 332c. However, the position of the potential barrier layer 334 is not limited thereto.

The first undoped barrier layer 335 is formed between the potential barrier layer 334 and the quantum well layers 332a and 332c.

The first undoped barrier layer 335 is made of GaN having a higher electrical resistance than that of the quantum well layers 332a and 332c or a barrier layer 332b, which are doped with a P-type or N-type dopant, and is disposed between the potential barrier layer 334 and the quantum well layers 332a and 332c so as to prevent direct contact between the potential barrier layer 334 and the quantum well layers 332a and 332c.

Further, as shown in FIGS. 11B and 12B, a potential compensation layer 337 may be formed in the active layer 332. The potential compensation layer 337 is formed at a position of a barrier layer 332d closest to the first semiconductor layer 331 or a barrier layer 332b second closest to the first semiconductor layer 331 out of barrier layers 332b and 332d of the active layer 332 by doping the barrier layer with silicon (Si).

Further, as shown in FIGS. 11C and 12C, a second undoped barrier layer 338 may be formed on the potential compensation layer 337. The second undoped barrier layer 338 is made of the same material as the first undoped barrier layer 335 and prevents direct contact between the potential compensation layer 337 and the quantum well layers 332a and 332c on the potential compensation layer 337.

The potential barrier layer 334, the first and second undoped barrier layers 335 and 338 and the potential compensation layer 337 are substantially equal to those of the former embodiments, and a detailed description thereof will thus be omitted.

A light transmitting electrode layer 340, a light extraction structure 342 and the second electrode layer 344 are formed on the second semiconductor layer 333.

The light transmitting electrode layer 340 may be made of at least one of ITO, IZO (In—ZnO), GZO (Ga—ZnO), AZO (Al—ZnO), AGZO (Al—Ga ZnO), IGZO (In—Ga ZnO), $IrO_x$, $RuO_x$, $RuO_x$/ITO, Ni/$IrO_x$/Au and Ni/$IrO_x$/Au/ITO, and is formed on the upper surface of the second semiconductor layer 333, thereby preventing current crowding.

The second electrode layer 344 includes at least one pad and/or electrode having a designated pattern. The second electrode layer 344 may be disposed at a central region, an edge region or a corner region on the upper surface of the second semiconductor layer 336, but the position of the second electrode layer 244 is not limited thereto.

The second electrode layer 344 may be formed in a single layer or multi-layer structure using a conductive material, for example, one selected from In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or an alloy thereof.

The second electrode layer 344 may be formed on the upper surface of the light transmitting electrode layer 340 or be formed by forming openings by removing some parts of the light transmitting electrode layer 340 such that the second electrode layer 344 contacts the second semiconductor layer 333, but formation of the second electrode pad 344 is not limited thereto.

The light extraction structure 342 is formed on the upper surface of the light emitting structure 330.

The light extraction structure 342 may be formed on the upper surface of the second semiconductor layer 333 or be formed on the upper surface of the light transmitting electrode layer 340 formed on the light transmitting structure 330, but formation of the light extraction structure 342 is not limited thereto.

The light extraction structure 342 may be formed at some regions or all regions on the upper surface of the light transmitting electrode layer 340 or the second semiconductor layer 333. The light extraction structure 342 is formed by performing an etching process upon at least one region of the upper surface of the light transmitting electrode layer 340 or the second semiconductor layer 333. Such an etching process includes a wet and/or dry etching process(es). Through the etching process, the upper surface of the light transmitting electrode layer 340 or the upper surface of the second semiconductor layer 333 has roughness forming the light extraction structure 342 having a height of 0.1 μM to 3 μm. The roughness having a random size may be irregularly formed, but is not limited thereto. The roughness means an uneven upper surface and includes at least one of a texture pattern, a concave-convex pattern and an uneven pattern.

The cross-section of the roughness may have various shapes, such as a cylinder, a polyprism, a cone, a polypyramid, a circular truncated cone and a frustum of a pyramid, and preferably has a conical or polypyramidal shape.

The light extraction structure 342 may be formed by a Photo-Electro Chemical (PEC) method, but formation of the light extraction structure 342 is not limited thereto. When the light extraction structure 342 is formed on the upper surface of the light transmitting electrode layer 340 or the second semiconductor layer 333, re-absorption of light generated by the active layer 332 into the active layer 332 or scattering of the light due to total reflection of the light by the upper surface of the light transmitting electrode layer 340 or the second semiconductor layer 333 is prevented, thereby contributing to improvement of light extraction efficiency of the light emitting device 300.

A passivation layer (not shown) may be formed on the side and upper surfaces of the light emitting structure 330. The passivation layer (not shown) is made of an insulating material.

Figure 13A:
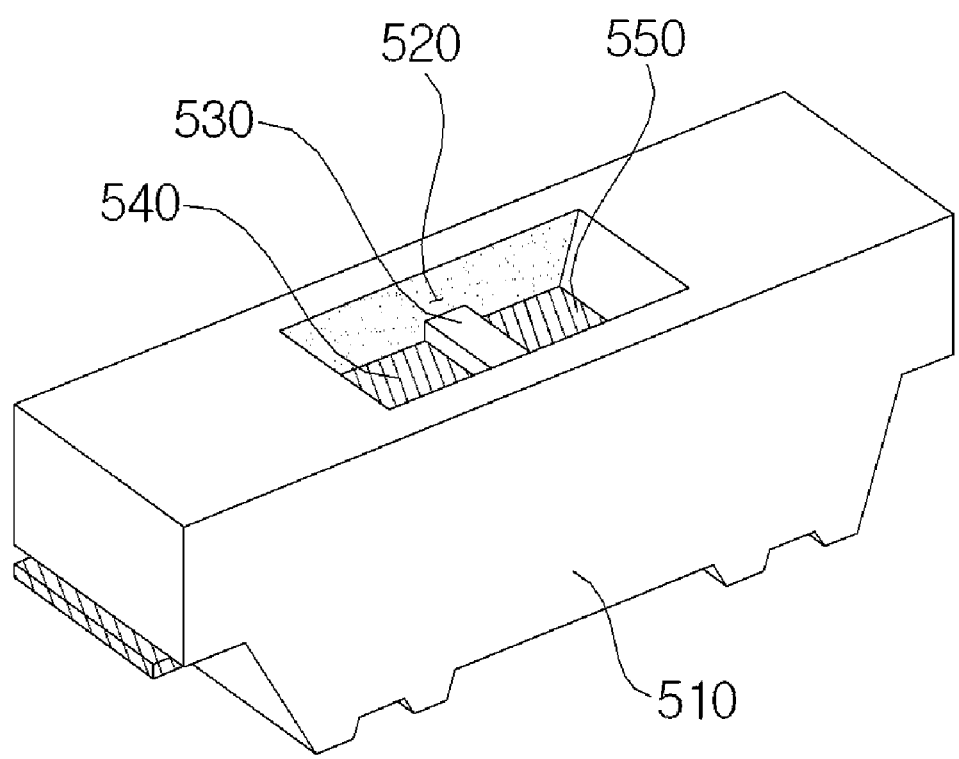
FIG. 13A is a perspective view of a light emitting device package having a light emitting device in accordance with another embodiment.
Figure 13B:
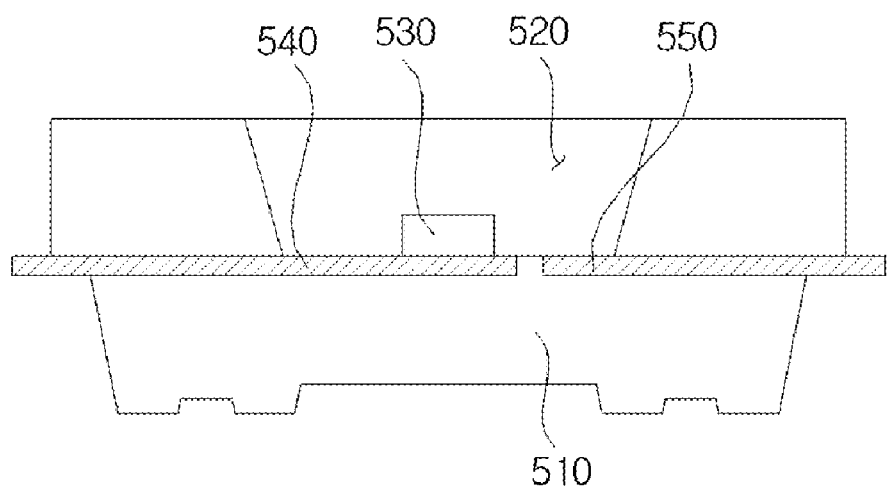
FIG. 13B is a cross-sectional view of the light emitting device package having the light emitting device in accordance with the embodiment.
Figure 13C:
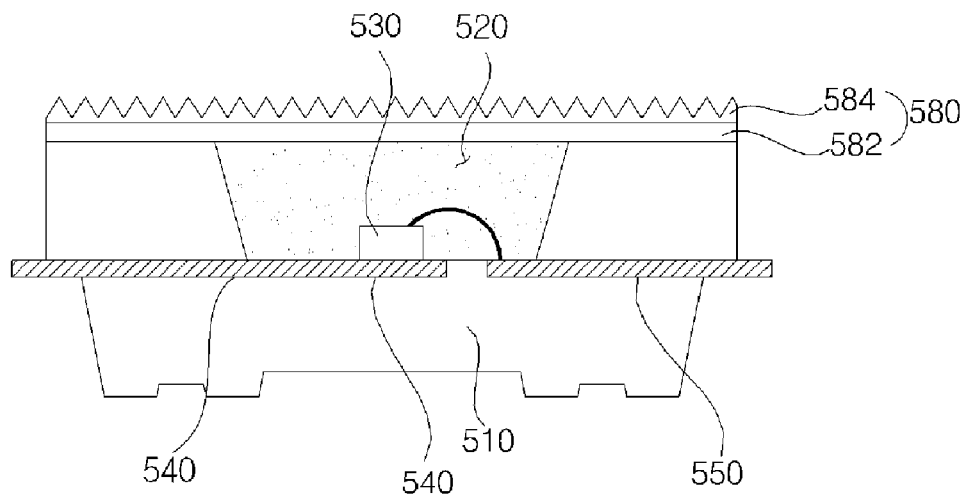
FIG. 13C is a cross-sectional view of the light emitting device package having the light emitting device in accordance with the embodiment.

FIGS. 13A to 13C are perspective and cross-sectional views of a light emitting device package in accordance with another embodiment.

With reference to FIGS. 13A to 13C, a light emitting device package 500 in accordance with this embodiment includes a body 510 provided with a cavity 520, first and second lead frames 540 and 550 mounted on the body 510, a light emitting device 530 electrically connected to the first and second lead frames 540 and 550, and a sealant (not shown) filling the cavity 520 to cover the light emitting device 530.

The body 510 may be made of at least one of a resin material such as polyphthalamide (PPA), silicon (Si), aluminum (Al), aluminum nitride (AlN), a liquid crystal polymer such as photo sensitive glass (PSG), polyamide 9T (PA9T), syndiotactic polystyrene (SPS), a metal, sapphire ($Al_2O_3$), beryllium oxide (BeO) and a printed circuit board (PCB). Further, the body 510 may be formed by injection molding or etching, but formation of the body 510 is not limited thereto.

The inner surface of the body 510 may be inclined. A reflection angle of light emitted from the light emitting device 530 may vary according to an angle of the inclined inner surface of the body 510, thereby enabling adjustment of an orientation angle of light emitted to the outside.

As the orientation angle of light decreases, convergence of the light emitted to the outside increases, and as the orientation angle of the light increases, convergence of the light emitted to the outside decreases.

As seen from the top, the cavity 520 of the body 510 may have various shapes including a circular shape, a rectangular shape, a polygonal shape, an oval shape and a shape with curved corners, but is not limited thereto.

The light emitting device 530 is mounted on the first lead frame 540. The light emitting device 530 may be a light emitting device to emit red, green, blue or white light or a UV light emitting device to emit ultraviolet light, but is not limited thereto. Further, at least one light emitting device 530 may be mounted.

As the light emitting device 530, a horizontal light emitting device in which electrical terminals are formed on the upper surface of the light emitting device, a vertical light emitting device in which electrical terminals are formed on the upper and lower surfaces of the light emitting device, or a flip chip light emitting device may be employed.

The light emitting device 530 in accordance with this embodiment includes a potential barrier layer (not shown), an undoped barrier layer (not shown) and/or a potential compensation layer (not shown), which are formed in an active layer (not shown), and thus light emission efficiency of the light emitting device 530 and the light emitting device package 500 may be improved.

Further, the light emitting device 530 has tolerance to ESD, and thus a Zener diode (not shown) may not be mounted on the light emitting device package 500. Therefore, reduction in brightness due to the Zener diode (not shown) may be prevented, and thus light emission efficiency of the light emitting device package 500 may be improved. Further, manufacturing costs of the light emitting device package 500 may be reduced.

The sealant (not shown) fills the cavity 520 so as to cover the light emitting device 530.

The sealant (not shown) made of silicon, epoxy or other resin materials fills the cavity 520, and ten cured using UV light or heat.

Further, the sealant (not shown) may include a phosphor, and a kind of phosphor is selected according to a wavelength of light emitted from the light emitting device 530 so as to allow the light emitting device package 500 to emit white light.

As the phosphor, one of a blue light emitting phosphor, a blue-green light emitting phosphor, a green light emitting phosphor, a yellow-green light emitting phosphor, a yellow light emitting phosphor, a yellow-red light emitting phosphor, an orange light emitting phosphor and a red light emitting phosphor may be selected according to the wavelength of light emitted from the light emitting device 530.

That is, the phosphor is excited by first light emitted from the light emitting device 530 and thus generates second light of a different wavelength. For example, if the light emitting device 530 is a blue light emitting diode and the phosphor is a yellow light emitting phosphor, the yellow light emitting phosphor is excited by blue light and thus generates yellow light, and the light emitting device package 500 provides white light through mixing of the blue light emitted by the blue light emitting diode and the yellow light generated by the yellow light emitting phosphor.

Similarly, if the light emitting device 530 is a green light emitting diode, a magenta light emitting phosphor is used or both blue and red light emitting phosphors are used, and if the light emitting device 530 is a red light emitting diode, a cyan light emitting phosphor is used or both blue and green light emitting phosphors are used.

These phosphors may be known YAG-based phosphors, TAG-based phosphors, sulfide-based phosphors, silicate-based phosphors, aluminate-based phosphors, nitride-based phosphors, carbide-based phosphors, nitridosilicate-based phosphors, borate-based phosphors, fluoride-based phosphors or phosphate-based phosphors.

The first and second lead frames 540 and 550 may be made of a metal, for example, at least one selected from titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe), or alloys thereof. Further, the first and second lead frames 540 and 550 may be formed in a single layer or multi-layer structure, but are not limited thereto.

The first and second lead frames 540 and 550 are separated from each other, and thus electrically isolated from each other. The light emitting device 530 is mounted on the first and second lead frames 540 and 550, and is electrically connected to the first and second lead frames 540 and 550 through direct contact or using a material having conductivity, such as a soldering member (not shown). Further, the light emitting device 530 may be electrically connected to the first and second lead frames 540 and 550 through wire bonding, but is not limited thereto. Therefore, when a power supply source is connected to the first and second lead frames 540 and 550, power is applied to the light emitting device 530. On the other hand, plural lead frames (not shown) may be mounted within the body 510 and be electrically connected to the light emitting device 530, but the structure of the light emitting device package 500 is not limited thereto.

With reference to FIG. 13C, the light emitting device package 500 in accordance with this embodiment includes an optical sheet 580, and the optical sheet 580 includes a base part 582 and a prism pattern 584.

The base part 582 is a support member on which the prism pattern 584 is formed. The base part 583 may be made of a transparent material having excellent thermal stability, for example, one selected from the group consisting of polyethylene terephthalate, polycarbonate, polypropylene, polyethylene, polystyrene and polyepoxy, and is not limited thereto.

Further, the base part 582 may include a phosphor (not shown). For example, the base part 582 may be formed by hardening a material to form the base part 582 under the condition that the phosphor (not shown) is uniformly dispersed in the material. In this case, the phosphor (not shown) may be uniformly distributed throughout the base part 582.

The prism pattern 584 having a three-dimensional shape so as to refract and converge light is formed on the base part 582. The prism pattern 584 may be made of acryl resin, but is not limited thereto.

The prism pattern 584 includes a plurality of linear prisms arranged in parallel in one direction on one surface of the base part 582, and the cross-section of the linear prisms taken along the line vertical to an axial direction of the linear prisms may have a rectangular shape.

Since the prism pattern 584 has an effect of converging light, if the prism sheet 580 is attached to the light emitting device package 500 of FIG. 6C, the prism sheet 580 improves straightness of light and thus improves brightness of light emitted from the light emitting device package 500.

Further, the prism pattern 584 may include a phosphor (not shown).

The prism pattern 584 in which the phosphor (not shown) is uniformly dispersed is obtained, for example, by mixing the phosphor with acryl resin into a paste and slurry state and then hardening the mixture.

If the prism pattern 584 includes the phosphor (not shown), uniformity and distribution of light emitted from the light emitting device package 500 are improved and a light dispersion effect by the phosphor (not shown) as well as a light convergence effect by the prism pattern 584 is obtained, thereby enabling improvement of an orientation angle of the light emitting device package 500.

An array of a plurality of light emitting device packages 500 in accordance with this embodiment may be arranged on a substrate, and optical members, such as a light guide plate, a prism sheet and a diffusion sheet, may be disposed on an optical path of the light emitting device packages 500. These light emitting device packages, the substrate and the optical members may form as a light unit. Another embodiment implements a display apparatus, an indicating apparatus, or a lighting apparatus including the light emitting devices or the light emitting device packages in accordance with the above-described embodiments. For example, the lighting apparatus may include a lamp or a streetlight.

Figure 14A:
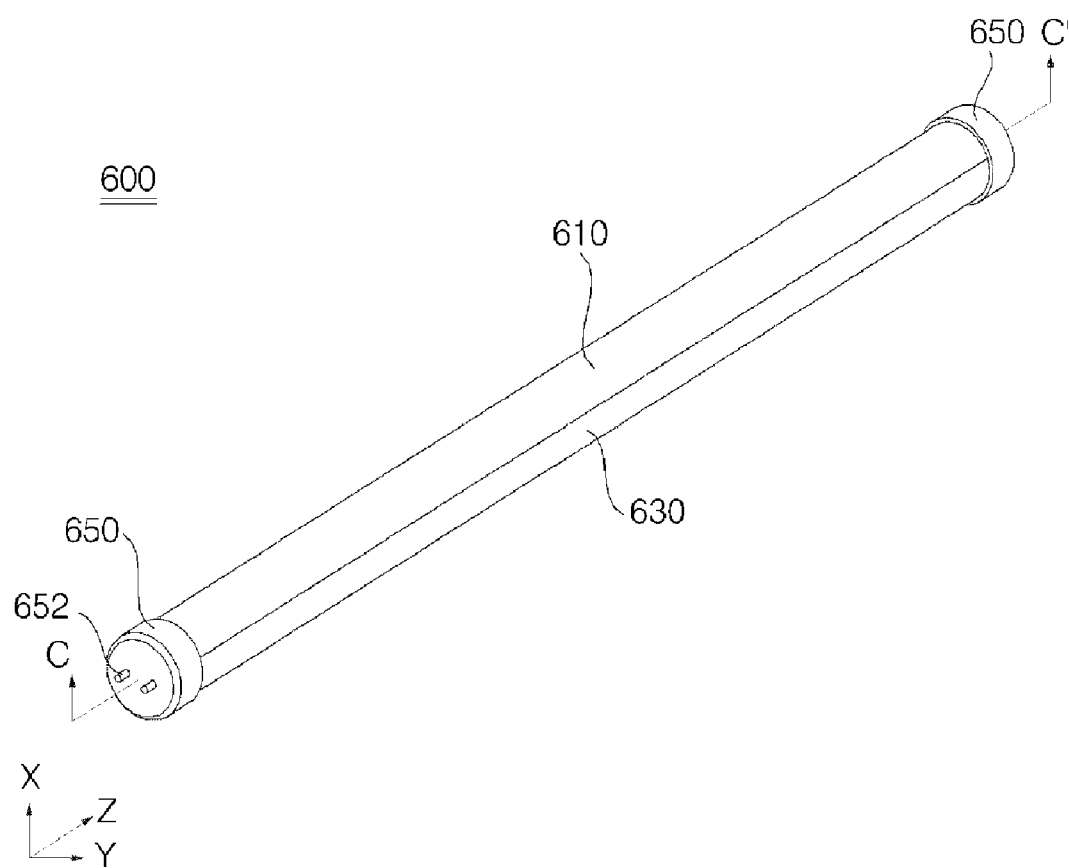
FIG. 14A is a perspective view of a lighting apparatus having light emitting device packages in accordance with another embodiment.
Figure 14B:
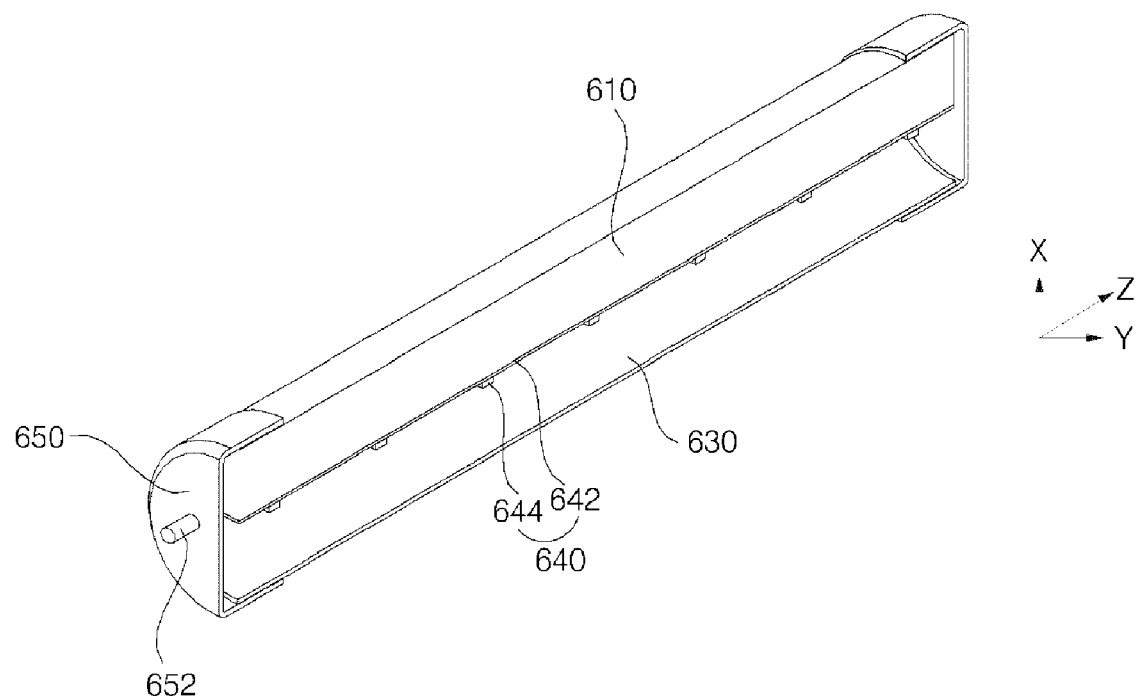
FIG. 14B is a cross-sectional view of the lighting apparatus having light emitting device packages in accordance with the embodiment.

FIG. 14A is a perspective view of a lighting apparatus having light emitting device packages in accordance with another embodiment, and FIG. 14B is a cross-sectional view of the lighting apparatus taken along the line C-C' of the lighting apparatus of FIG. 14A.

With reference to FIGS. 14A and 14B, a lighting apparatus 600 in accordance with this embodiment includes a body 610, a cover 630 connected to the body 610, and end caps 650 located at both ends of the body 610.

A light emitting device module 640 is connected to the lower surface of the body 610, and the body 610 is made of a metal having excellent conductivity and heat dissipation characteristics so as to discharge heat generated by light emitting device packages 644 to the outside through the upper surface of the body 610.

The light emitting device packages 644 emitting multiple colors of light are be mounted in multiple rows on a printed circuit board (PCB) 642. The light emitting device packages 644 are mounted at the same separation distance or at various separation distances from each other as needed, thereby enabling adjustment of brightness of the lighting apparatus 600. A metal core PCB (MCPCB) or a PCB made of FR4 may be used as the PCB 642.

Particularly, the light emitting device package 644 includes a light emitting device (not shown), and light emitting device (not shown) in accordance with this embodiment includes a potential barrier layer (not shown), an undoped barrier layer (not shown) and/or a potential compensation layer (not shown), which are formed in an active layer (not shown), thereby improving light emission efficiency of the light emitting device package 644 and the lighting apparatus 600.

Further, the light emitting device (not shown) has tolerance to ESD, and thus a Zener diode (not shown) may not be mounted on the light emitting device package 644. Therefore, reduction in brightness due to the Zener diode (not shown) may be prevented, and thus light emission efficiency of the light emitting device package 644 and the lighting apparatus 600 may be improved. Further, manufacturing costs of the light emitting device package 644 and the lighting apparatus 600 may be reduced.

The cover 630 may be formed in a circular shape so as to surround the lower surface of the body 610, but the shape of the cover 630 is not limited thereto.

The cover 630 protects the light emitting device module 640 provided therein from external foreign substances. Further, the cover 630 may include diffusion particles to prevent glare due to light generated by the light emitting device packages 644 and to uniformly dissipate the heat to the outside, and a prism pattern may be formed on at least one of an internal surface and an external surface of the cover 630. Moreover, a phosphor may be applied to at least one of the internal surface and the external surface of the cover 630.

Since the heat generated by the light emitting device packages 644 is dissipated to the outside through the cover 630, the cover 630 needs to have excellent light transmittance and to have sufficient heat resistance so as to withstand the heat generated by the light emitting device packages 644. Therefore, the cover 630 is preferably made of a material including polyethylene terephthalate (PET), polycarbonate (PC) or polymethyl methacrylate (PMMA).

The end caps 650 are located at both ends of the body 610 and may be used to seal a power supply device (not shown). Further, power pins 652 are formed on the end caps 650, and thus the lighting apparatus 600 in accordance with this embodiment may be directly inserted into terminals, from which a conventional fluorescent lamp is removed, without the need for any separate device.

Figure 15:
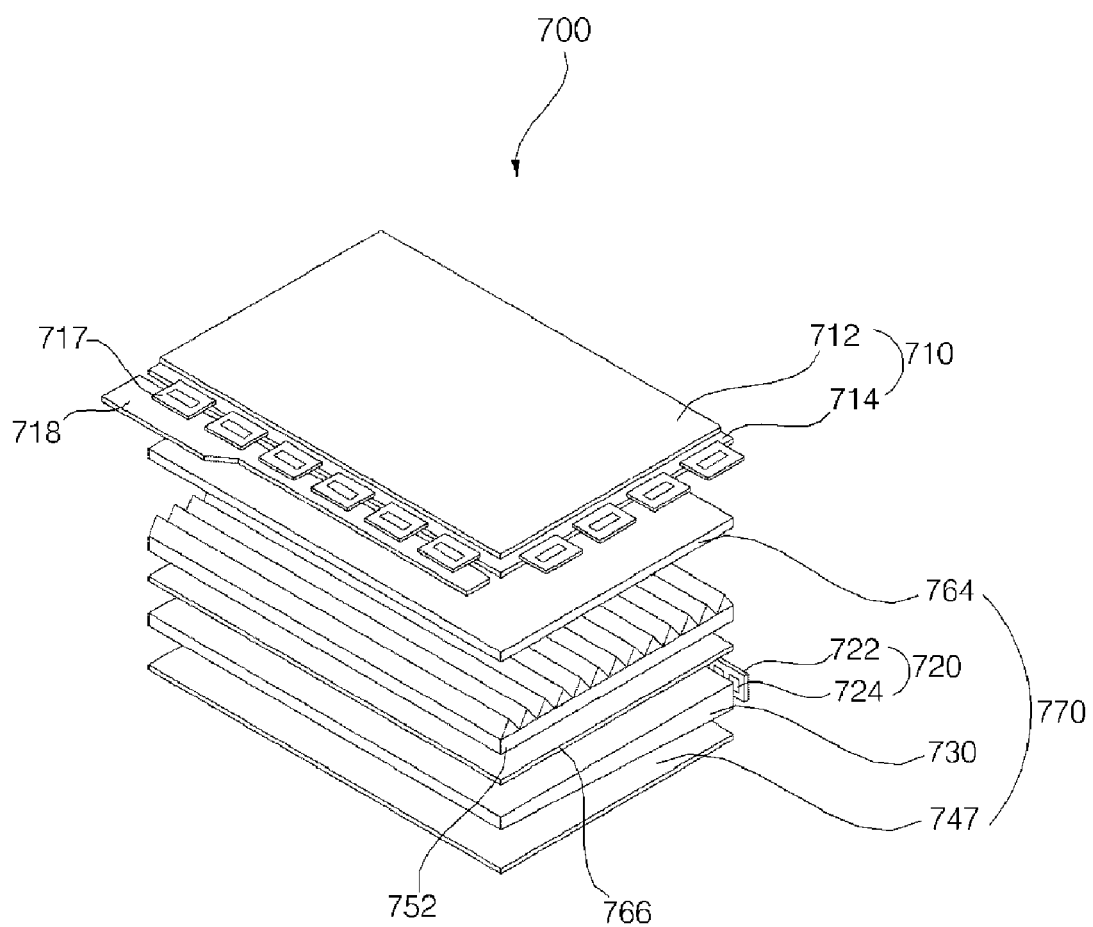
FIG. 15 is an exploded perspective view of a liquid crystal display apparatus having light emitting device packages in accordance with another embodiment.

FIG. 15 is an exploded perspective view of a liquid crystal display apparatus having light emitting device packages in accordance with another embodiment.

FIG. 15 illustrates an edge type liquid crystal display apparatus 700, and the liquid crystal display apparatus 700 includes a liquid crystal display panel 710 and a backlight unit 770 to supply light to the liquid crystal display panel 710.

The liquid crystal display panel 710 displays an image using the light supplied from the backlight unit 770. The liquid crystal display panel 710 includes a color filter substrate 710 and a thin film transistor substrate 714 which are opposite each other such that a liquid crystal layer is interposed therebetween.

The color filter substrate 712 implements colors of an image displayed through the liquid crystal display panel 710.

The thin film transistor substrate 714 is electrically connected to a PCB 718, on which a plurality of circuit parts is mounted, through drive films 717. The thin film transistor substrate 714 applies drive voltage supplied from the PCB 718 to the liquid crystal layer in response to a drive signal supplied from the PCB 718.

The thin film transistor substrate 714 includes thin film transistors and pixel electrodes formed on a base substrate made of a transparent material, such as glass or plastic.

The backlight unit 770 includes a light emitting device module 720 to output light, a light guide plate 730 to convert light supplied from the light emitting device module 720 into surface light and to supply the surface light to the liquid crystal display panel 710, a plurality of films 752, 766 and 764 to uniformize brightness distribution of light supplied from the light guide plate 730 and to improve a vertical incident property of the light, and a reflective sheet 740 to reflect light emitted from the rear portion of the light guide plate 730 back to the light guide plate 730.

The light emitting device module 720 includes a plurality of light emitting device packages 724 and a PCB 722 on which an array of the plurality of light emitting device packages 724 is mounted.

Particularly, the light emitting device package 724 includes a light emitting device (not shown), and light emitting device (not shown) in accordance with this embodiment includes a potential barrier layer (not shown), an undoped barrier layer (not shown) and/or a potential compensation layer (not shown), which are formed in an active layer (not shown), thereby improving light emission efficiency of the light emitting device package 724 and the backlight unit 770.

Further, the light emitting device (not shown) has tolerance to ESD, and thus a Zener diode (not shown) may not be mounted on the light emitting device package 724. Therefore, reduction in brightness due to the Zener diode (not shown) may be prevented, and thus light emission efficiency of the light emitting device package 724 and the backlight unit 770 may be improved. Further, manufacturing costs of the light emitting device package 724 and the backlight unit 770 may be reduced.

The plurality of films 752, 766 and 764 of the backlight unit 770 includes a diffusion film 766 to diffuse light incident from the light guide plate 730 towards the liquid crystal display panel 710, a prism film 752 to converge the spread light so as to improve the vertical incident property of the light, and a protective film 764 to protect the prism film 752.

Figure 16:
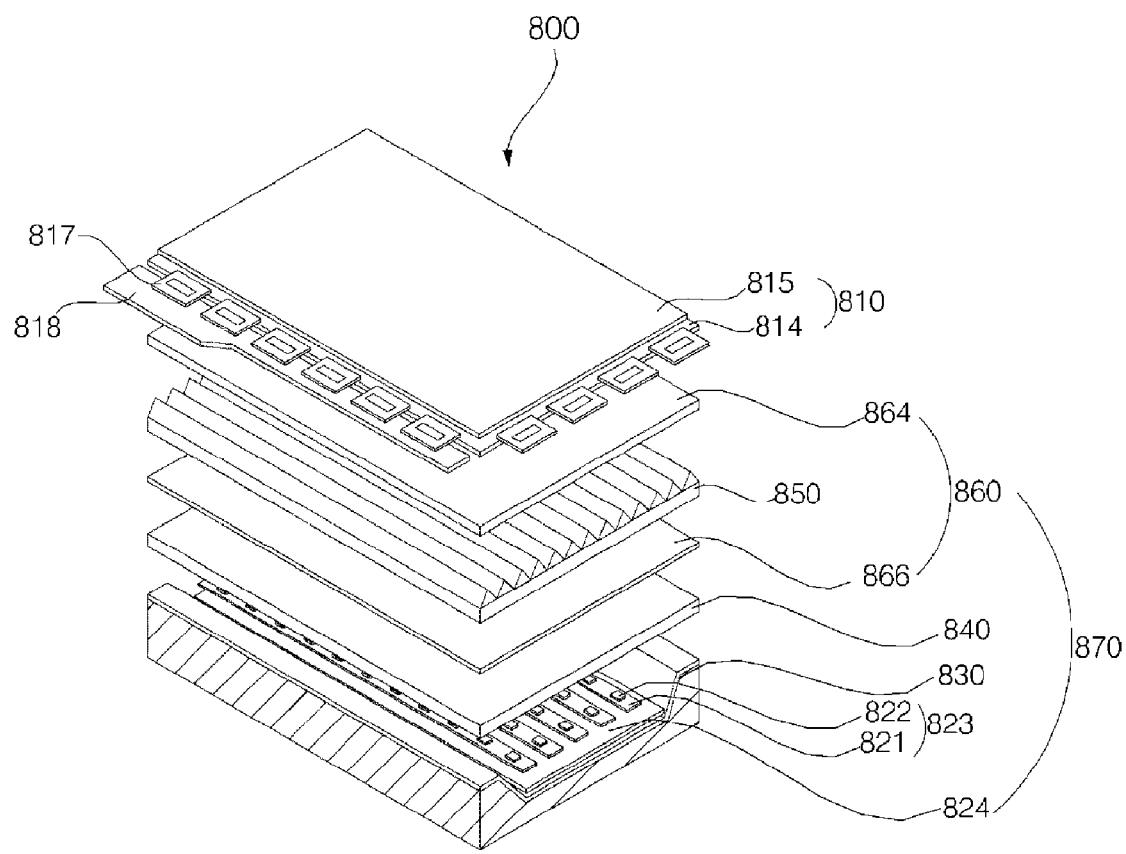
FIG. 16 is an exploded perspective view of a liquid crystal display apparatus having light emitting device packages in accordance with another embodiment.

FIG. 16 is an exploded perspective view of a liquid crystal display apparatus having light emitting device packages in accordance with another embodiment. Some parts of the liquid crystal display apparatus of this embodiment are substantially equal to those of the former embodiment shown in FIG. 15, and a detailed description thereof will thus be omitted.

FIG. 16 illustrates a direct type liquid crystal display apparatus 800, and the liquid crystal display apparatus 800 includes a liquid crystal display panel 810 and a backlight unit 870 to supply light to the liquid crystal display panel 810.

The liquid crystal display panel 810 is the same as the liquid crystal display panel 710 shown in FIG. 15, and a detailed description thereof will thus be omitted.

The backlight unit 870 includes a plurality of light emitting device modules 823, a reflective sheet 824, a lower chassis 830 to receive the light emitting device modules 823 and the reflective sheet 824, and a diffusion plate 840 and a plurality of optical films 860 disposed on the light emitting device modules 823.

Each of the light emitting device modules 823 includes a plurality of light emitting device packages 822 and a PCB 821 on which an array of the plurality of light emitting device packages 822 is mounted.

Particularly, the light emitting device package 822 includes a light emitting device (not shown), and light emitting device (not shown) in accordance with this embodiment includes an intermediate layer (not shown) located on and/or under an active layer (not shown), thereby improving light emission efficiency of the light emitting device (not shown), the light emitting device package 822 and the liquid crystal display apparatus 800.

Further, the light emitting device (not shown) has tolerance to ESD, and thus a Zener diode (not shown) may not be mounted on the light emitting device package 822. Therefore, reduction in brightness due to the Zener diode (not shown) may be prevented, and thus light emission efficiency of the light emitting device package 822 and the backlight unit 870 may be improved. Further, manufacturing costs of the light emitting device package 822 and the backlight unit 870 may be reduced.

The reflective sheet 824 reflects light generated by the light emitting device packages 822 toward the liquid crystal display panel 810, thereby improving utility efficiency of the light.

The light generated by the light emitting device modules 823 is incident upon the diffusion plate 840, and the plurality of optical films 860 is disposed on the diffusion plate 840. The plurality of optical films 860 includes a diffusion film 866, a prism film 850 and a protective film 864.

The features, structures and effects of the light emitting devices illustrated in the above embodiments may be included in at least one embodiment but are not limited to one embodiment. Further, those skilled in the art will appreciate that various combinations and modifications of the features, structures and effects illustrated in the respective embodiments are possible. Therefore, it will be understood that these combinations and modifications are covered by the scope of the embodiment.

Although the embodiments have been disclosed for illustrative purposes, those skilled in the art will appreciate that various modifications, additions and substitutions are possible, without departing from the scope and spirit of the invention as disclosed in the accompanying claims. For example, the respective elements described in detail in the embodiments may be modified. Further, it will be understood that differences relating to these modifications, additions and substitutions are covered by the scope of the invention defined in the accompanying claims.

What is claimed is:

1. A light emitting device, comprising:
a support member;
a light emitting structure on the support member and including
a first conductive semiconductor layer,
a second conductive semiconductor layer, and an active layer interposed between the first conductive semiconductor layer and the second conductive semiconductor layer, wherein the active layer includes:
- a light emitting layer in which a plurality of quantum well layers and a plurality of barrier layers are alternately formed,
- a potential barrier layer provided located between the light emitting layer and the first conductive semiconductor layer, the potential barrier layer configured to delay a time during which an electrostatic discharge (ESD) proceeds from the first conductive semiconductor layer to the light emitting layer, and
- an undoped barrier layer provided between the light emitting layer and the potential barrier layer, the undoped barrier layer arranged to isolate the potential barrier layer and the light emitting layer from each other;
- a potential compensation layer configured to compensate for a forward voltage drop due to the potential barrier layer; and
- a second undoped barrier layer provided between the potential compensation layer and the light emitting layer, the second undoped barrier layer arranged to isolate the potential compensation layer and the light emitting layer from each other.

2. The light emitting device according to claim 1, wherein the potential barrier layer is located between the first conductive semiconductor layer and a first quantum well layer of the plurality of quantum well layers of the light emitting layer.

3. The light emitting device according to claim 2, wherein the potential barrier layer is a quantum well layer of the plurality of quantum well layers that is located closest to the first conductive semiconductor layer.

4. The light emitting device according to claim 1, wherein the potential compensation layer is located between the second conductive semiconductor layer and a quantum well layer of the plurality of quantum well layers that is located closest to the second conductive semiconductor layer.

5. The light emitting device according to claim 1, wherein the undoped barrier layer has a thickness of 1.5 to 7.5 times that of a barrier layer of the plurality of barrier layers.

6. The light emitting device according to claim 5, wherein the undoped barrier layer has a thickness of 7.5 to 100 times that of the potential barrier layer.

7. The light emitting device according to claim 4, wherein the potential compensation layer is a barrier layer of the plurality of barrier layers that is located closest to the second conductive semiconductor layer.

8. The light emitting device according to claim 1, wherein the potential compensation layer includes at least one of C, Si, Ge and Sn.

9. The light emitting device according to claim 1, wherein the potential compensation layer has a thickness of 30~150 Å.

10. The light emitting device according to claim 1, wherein the potential barrier layer has a thickness of 3.5~40 Å.

11. The light emitting device according to claim 1, wherein the potential barrier layer includes two potential barrier layers.

12. The light emitting device according to claim 1, wherein the potential barrier layer includes InN.

13. The light emitting device according to claim 12, wherein a concentration of the InN is 80% to 100%.

14. The light emitting device according to claim 1, wherein the undoped barrier layer is made of GaN and has a higher electrical resistance than that of the plurality of quantum well layers.

15. The light emitting device according to claim 1, wherein the potential barrier layer diffuses carriers traveling from the first conductive semiconductor layer to the light emitting layer.

16. The light emitting device according to claim 1, wherein the potential compensation layer has a thickness greater than that of the potential barrier layer and smaller than that of the undoped barrier layer.

17. The light emitting device according to claim 1, wherein the potential compensation layer has the same thickness as that of the plurality of barrier layers.

18. The light emitting device according to claim 1, further comprising:
- an undoped GaN layer formed between the support member and the first conductive semiconductor layer.

19. The light emitting device according to claim 18, further comprising:
- an insertion layer formed between the undoped GaN layer and the first conductive semiconductor, the insertion layer configured to minimize a lattice mismatch of the first semiconductor layer.

20. A lighting apparatus, comprising:
a body;
light emitting device modules disposed on the body such that light emitting devices are mounted on each of the light emitting device modules,
wherein each of the light emitting devices includes:
- a support member; and
- a light emitting structure on the support member and including
  - a first conductive semiconductor layer,
  - a second conductive semiconductor layer, and
  - an active layer interposed between the first conductive semiconductor layer and the second conductive semiconductor layer, wherein the active layer includes:
- a light emitting layer in which a plurality of quantum well layers and a plurality of barrier layers are alternately formed,
- a potential barrier layer provided located between the light emitting layer and the first conductive semiconductor layer, the potential barrier layer configured to delay a time during which electrostatic discharge (ESD) proceeds from the first conductive semiconductor layer to the light emitting layer, and
- an undoped barrier layer provided between the light emitting layer and the potential barrier layer, the undoped barrier layer configured to isolate the potential barrier layer and the light emitting layer from each other;
- a potential compensation layer to compensate for a forward voltage drop due to the potential barrier layer; and
- a second undoped barrier layer provided between the potential compensation layer and the light emitting layer, the second undoped barrier layer configured to isolate the potential compensation layer and the light emitting layer from each other.

* * * * *